United States Patent
Ogihara

(10) Patent No.: US 7,642,560 B2
(45) Date of Patent: Jan. 5, 2010

(54) COMPOSITE SEMICONDUCTOR LIGHT-EMITTING DEVICE

(75) Inventor: Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 11/534,688

(22) Filed: Sep. 25, 2006

(65) Prior Publication Data

US 2007/0069220 A1  Mar. 29, 2007

(30) Foreign Application Priority Data

Sep. 27, 2005  (JP)  ............................... 2005-280822

(51) Int. Cl.
  H01L 33/00  (2006.01)
(52) U.S. Cl. ............................. 257/90; 257/89; 257/94; 257/E33.008; 257/E33.012; 257/E33.023; 257/E33.025; 257/E33.028
(58) Field of Classification Search .................. 257/79, 257/89, 90, 94, E33.12, E33.008, E33.023, 257/E33.025, E33.028
See application file for complete search history.

(56) References Cited

U.S. PATENT DOCUMENTS 5,851,905 A * 12/1998 McIntosh et al. ............ 438/492
6,100,103 A * 8/2000 Shim et al. .................... 438/26

FOREIGN PATENT DOCUMENTS

JP  2001007401 A  1/2001

* cited by examiner

Primary Examiner—Kiesha L Rose
Assistant Examiner—Minchul Yang
(74) Attorney, Agent, or Firm—Panitch Schwarze Belisario & Nadel LLP

(57) ABSTRACT

A composite semiconductor light-emitting device includes a first semiconductor element portion made of a first semiconductor material and a second semiconductor element portion made of a second semiconductor material different from the first semiconductor material. The first semiconductor element portion has a first semiconductor layered structure, and the second semiconductor element portion has a second semiconductor layered structure. The first semiconductor element portion has a plurality of light-emitting regions that emit lights of different wavelengths. The second semiconductor element portion has at least one light-emitting region that emits light whose wavelength is different from the lights emitted by the light-emitting regions of the first semiconductor element portion. The light-emitting regions of the first semiconductor element portion and at least one light-emitting region of the second semiconductor element portion are electrically connected to each other.

27 Claims, 34 Drawing Sheets

COMPOSITE SEMICONDUCTOR LIGHT-EMITTING DEVICE

BACKGROUND OF THE INVENTION

This invention relates to a composite semiconductor light-emitting device on which a plurality of light-emitting regions are formed using compound semiconductor layers. Particularly, this invention relates to a composite semiconductor light-emitting device capable of emitting lights of different wavelengths.

There is known a light-emitting diode (LED) capable of emitting lights of different wavelengths. Such a conventional light-emitting diode includes a first light-emitting layer sandwiched between a p-type compound semiconductor epitaxial layer and an n-type compound semiconductor epitaxial layer, and a second light-emitting layer sandwiched between two compound semiconductor layers (containing impurities) whose conductivity types are the same as one of the p-type compound semiconductor layer and the n-type compound semiconductor layer. The second light-emitting layer emits the light whose wavelength is longer than the light emitted by the first light-emitting layer. Such a conventional light-emitting diode is disclosed in, for example, Japanese Laid-Open Patent Publication No. 2001-7401. The light-emitting diode is known as a compound semiconductor light-emitting element that emits white light, which is suitable for a lighting device used in various kinds of display devices such as a backlight of an LCD display device.

The light-emitting element (disclosed in the above described publication) has a layered structure including a single crystal ZnSe substrate (i.e., a lower light-emitting layer) that emits the light upon self-excitation and a ZnSe-based compound semiconductor layer layered on the substrate. A light-emitting layer (i.e., an intermediate light-emitting layer) composed of ZnSeTe and cladding layers sandwiching the intermediate light-emitting layer are formed on the compound semiconductor layer. Another light-emitting layer (i.e., an uppermost light-emitting layer) composed of ZnSe/ZnCdSe multi-quantum well is formed on the upper cladding layer. The uppermost light-emitting layer emits the light of cyan whose wavelength is 480 nm, the intermediate light-emitting layer emits the light of green whose wavelength is 515 nm, and the ZnSe substrate emits the light of yellow.

However, in the layered structure including the semiconductor layers and the substrate that emit lights of different wavelengths as disclosed in the above described publication, it is necessary to match the lattice constants of the layered semiconductor materials to each other, and therefore the kinds of semiconductor materials that can be used are limited. To be more specific, on the single crystal ZnSe substrate, it is possible to grow the same ZnSe-based compound semiconductor layers, but it is difficult to continuously grow a GaN-based semiconductor layer (capable of emitting blue or green light) and a GaAs-based semiconductor layer (capable of emitting red light) on the crystal substrate in terms of lattice constants.

Further, even if it becomes possible to emit lights of the respective wavelengths, there is a case where the intensity of one of the lights of respective wavelengths is weak. In order to uniformly balance the intensities of the lights of respective wavelengths, the intensities of the whole lights must decrease.

SUMMARY OF THE INVENTION

An object of the present invention is to provide a composite semiconductor light-emitting device capable of removing limitations when light-emitting elements emitting lights of different wavelengths are layered, capable of efficiently emitting light, and enabling easy control of the colors of the lights.

The present invention provides a composite semiconductor light-emitting device including a first semiconductor element portion including a first semiconductor material and having a first semiconductor layered structure, and a second semiconductor element portion including a second semiconductor material different from the first semiconductor materials and having a second semiconductor layered structure. The first semiconductor element portion has a plurality of light-emitting regions that emit lights of different wavelengths. The second semiconductor element portion has at least a light-emitting region that emits light whose wavelength is different from the light emitted by the light-emitting regions of the first semiconductor substrate. The light-emitting regions of the first semiconductor element portion and at least one light-emitting region of the second semiconductor element portion are electrically connected to each other.

With such an arrangement, it becomes possible to form a plurality of semiconductor light-emitting regions composed of materials of a plurality of groups, and therefore it becomes possible to enhance the efficiency of light-emission, while maintaining the balance of the intensities of the lights of respective wavelengths. In particular, in the case where the combination of the nitride-based semiconductor material and the GaAs-based semiconductor material or the like is used, it becomes possible to obtain the stable light-emission, which is useful in the lighting units of various kinds of display devices, particularly, the backlight of the LCD display device.

DETAILED DESCRIPTION OF THE PREFERRED EMBODIMENT

Embodiments of the present invention will be described with reference to the attached drawings.

Embodiment 1

Figure 1:
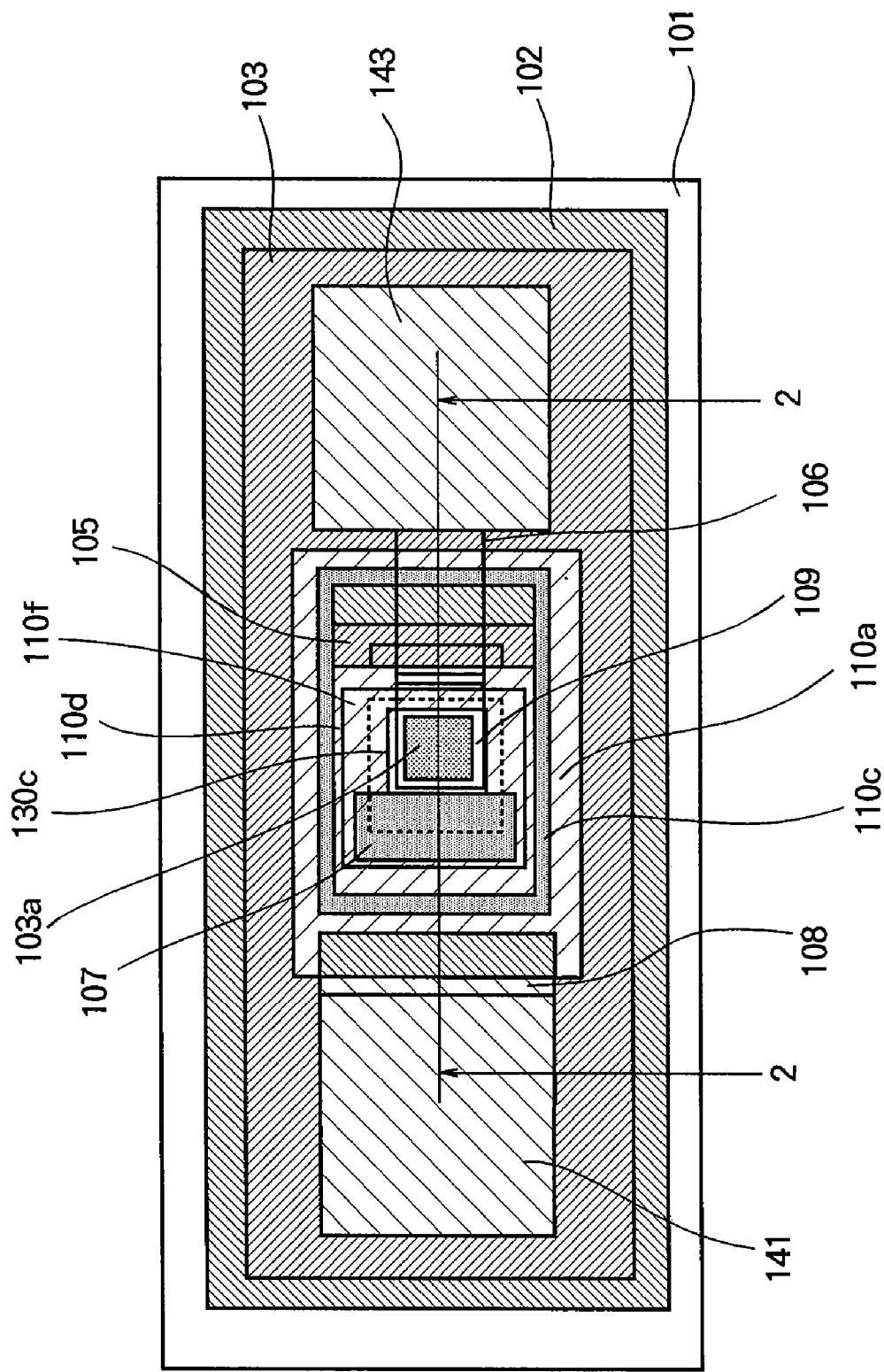
FIG. 1 is a plan view of a composite semiconductor light-emitting device according to the first embodiment of the present invention.
Figure 2:
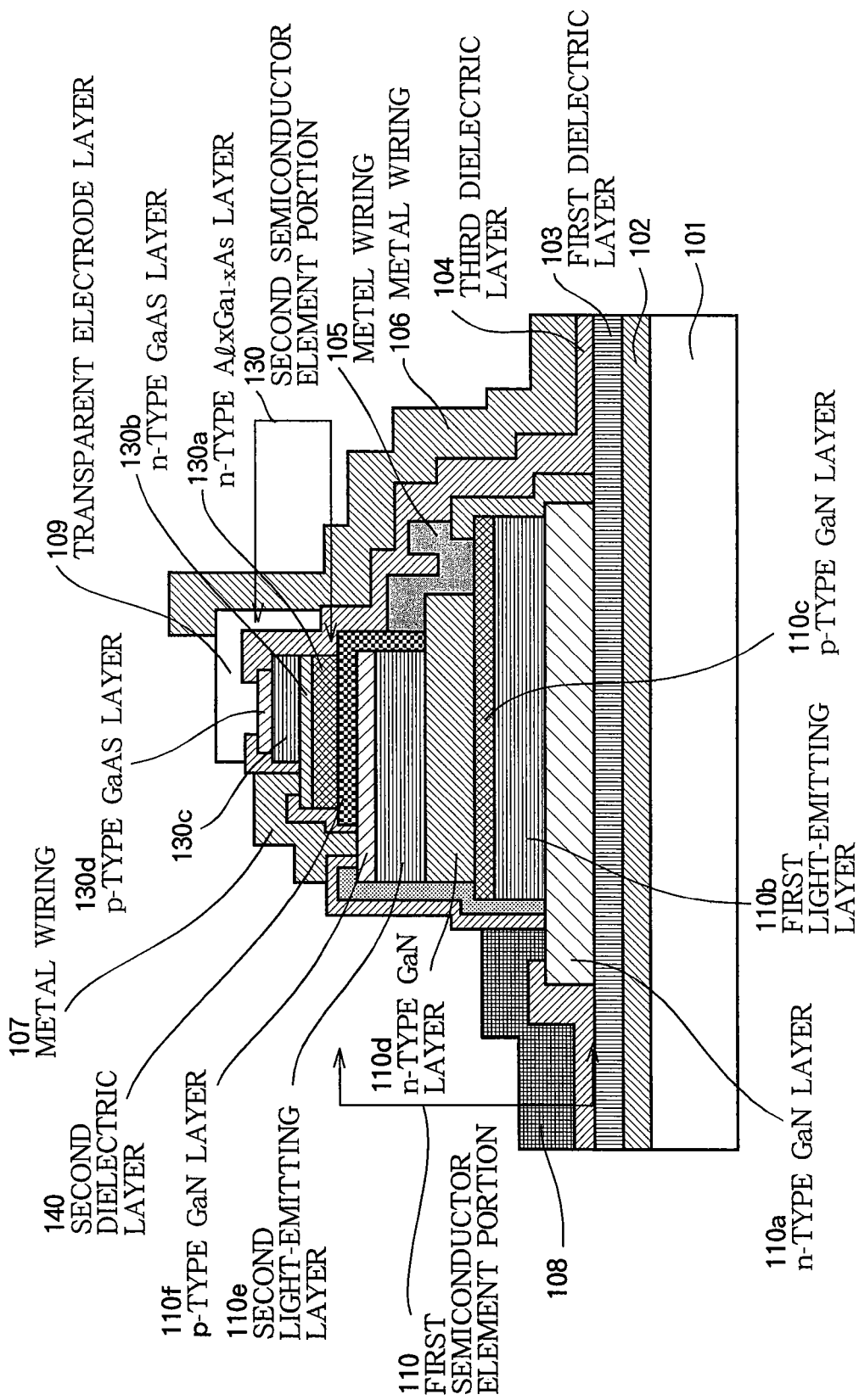
FIG. 2 is a sectional view of the composite semiconductor light-emitting device of the first embodiment of the present invention, taken along line 2-2 in FIG. 1.

FIG. 1 is a plan view schematically showing a composite semiconductor light-emitting device according to the first embodiment of the present invention. FIG. 2 is a sectional view taken along line 2-2 in FIG. 1.

As shown in FIG. 2, the composite semiconductor light-emitting device of the first embodiment includes a substrate 101, a metal layer 102 (that functions as a reflection film) formed on the substrate 101 and a first dielectric layer 103 formed on the metal layer 102. A first semiconductor element portion 110 is formed on the first dielectric layer 103, and a second semiconductor element portion 130 is formed on the first semiconductor element portion 110. The first semiconductor element portion 110 has a first semiconductor layered structure, and includes first and second light-emitting regions. The second semiconductor element portion 130 has a second semiconductor layered structure, and includes a third light-emitting region. The first semiconductor layered structure is made of first semiconductor materials, and particularly, GaN-based nitride semiconductor materials such as GaN, $Al_xGa_{1-x}N$, $Ga_xIn_{1-x}N$. The second semiconductor layered structure is made of second semiconductor materials (of a group different from the first semiconductor materials), and particularly, semiconductor materials such as $Al_xGa_yIn_{1-x-y}P$ and $Al_xGa_{1-x}As$.

The structure of the first semiconductor element portion 110 will be described. First, an n-type GaN layer 110a is formed on the first dielectric layer 103. A first light-emitting layer 110b is formed on the n-type GaN layer 110a. The first light-emitting layer 110b includes a GaInN/GaN multi-quantum well layer and a p-type AlGaN layer. A p-type GaN layer 110c is formed on the first light-emitting layer 110b. The n-type GaN layer 110a, the first light-emitting layer 110b and the p-type GaN layer 110c constitute a first light-emitting region, on which a second light-emitting region is formed.

The second light-emitting region includes an n-type GaN layer 110d formed on the p-type GaN layer 110c, a second light-emitting layer 110e (including a GaInN/GaN multi-quantum well layer and a p-type AlGaN layer) formed on the n-type GaN layer 110d and a p-type GaN layer 110f formed on the second light-emitting layer 110e. InN mole fraction of the second light-emitting layer 110e is smaller than that of the first light-emitting layer 110b. The above described layers are covered by a second dielectric layer 140. Openings are formed on the second dielectric layer 140 where contacts are to be formed.

The wavelength of the light emitted by the first light-emitting layer 110b is, for example, 515 nm (i.e., green). The wavelength of the light emitted by the second light-emitting layer 110e is, for example, 460 nm (i.e., blue). Thus, in the composite semiconductor light-emitting device according to the first embodiment, it is possible to obtain the lights of different wavelengths emitted by the semiconductor layered structures.

The structure of the second semiconductor element portion 130 will be described. The second semiconductor element portion 130 is made of GaAs-based III-V compound semiconductor materials, and includes an n-type $Al_xGa_{1-x}As$ layer 130a formed on the second dielectric layer 140, an n-type GaAs layer 130b formed on the n-type $Al_xGa_{1-x}As$ layer 130a, a third light-emitting layer 130c (including semiconductor layers of an n-type $Al_yGa_{1-y}As$ cladding layer, an n-type $Al_zGa_{1-z}As$ active layer and a p-type $Al_tGa_{1-t}As$ cladding layer) formed on the n-type GaAs layer 130b, and a p-type GaAs layer 130d formed on the third light-emitting layer 130c. The wavelength of the light emitted by the third light-emitting layer 130c of the second semiconductor element portion 130 is, for example, 750 nm. Alternatively, it is possible use $(Al_xGa_{1-x})_yIn_{1-y}P$ based materials, to thereby obtain the emission of the red light whose wavelength is approximately 650 nm. The second semiconductor element portion 130 is, for example, wholly bonded onto the second dielectric layer 140.

Metal wirings 105 and 107 electrically connect n-side contact layers and p-side contact layers of the respective light-emitting regions. In particular, the metal wiring 105 electrically connects the first light-emitting region and the second light-emitting region, i.e., electrically connects the p-type GaN layer 110c and n-type GaN layer 110d. The metal wiring 107 electrically connects the second light-emitting region and the second semiconductor element portion 130, i.e., electrically connects the p-type GaN layer 110f and the n-type GaAs layer 130b of the second semiconductor element portion 130. As shown in FIG. 1, an n-side electrode pad 141 and a p-side electrode pad 143 are provided on both sides of the main part of the composite semiconductor light-emitting device. Each of the n-side electrode pad 141 and the p-side electrode pad 143 substantially has a rectangular shape. The electrode pads 141 and 143 is supplied with current by performing wire-bonding or forming wirings thereon. As shown in FIG. 2, a metal wiring 108 electrically connects the n-side electrode pad 141 and the n-type GaN layer 110a. A metal wiring 106 electrically connects the p-side electrode pad 143 and a transparent conductive layer 109 (i.e., a transparent electrode) formed as an uppermost layer covering the p-type GaAs layer 130d. In this regard, instead of the transparent electrode 109, it is possible to use a metal contact that partially covers the upper surface of the p-type GaAs layer 130d. As shown in FIGS. 1 and 2, the first light-emitting region, the second light-emitting region and the third light-emitting region are electrically connected in series with each other.

The first and second semiconductor element portions 110 and 130 (FIG. 2) are formed by growing semiconductor layered structures on different substrates, and separating (peeling off) the semiconductor layered structures from the respective substrates. The first and second semiconductor element portions 110 and 130 are bonded to each other on the substrate 101. Particularly, the second semiconductor element portion 130 is bonded onto the first semiconductor element portion 110. The first semiconductor element portion 110 is bonded onto, for example, the first dielectric layer 103 provided for bonding. The second semiconductor element portion 130 is bonded to, for example, the second dielectric layer 140 provided for bonding. A metal layer 102 is formed below the first and second semiconductor element portions (for example, below the first dielectric layer 103). The lights emitted downward from the respective light-emitting regions are reflected upward by the metal layer 102, and therefore the amount of the emitted light can be enhanced.

The semiconductor layered structure shown in FIGS. 1 and 2 is an example, and it is also possible to employ other semiconductor layered structures. FIGS. 3 through 6 show examples of the semiconductor layered structure of the nitride compound semiconductor.

Figure 3:
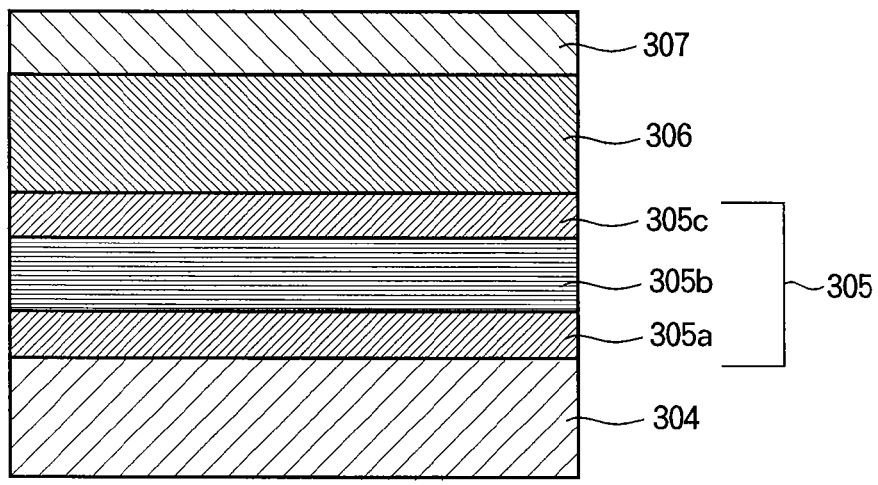
FIG. 3 is a sectional view of a first example of an element structure applicable to the composite semiconductor light-emitting device of the first embodiment of the present invention.

FIG. 3 shows a semiconductor layered structure (including the light-emitting region) formed by layering an n-type GaN layer 304, an InGaN/GaN multi-quantum well layer 305, a p-type AlGaN layer 306, and a p-type GaN layer 307. For example, in relation to FIG. 2, the first light-emitting layer 110b or the second light-emitting layer 110e of FIG. 2 corresponds to the layered structure of the InGaN/GaN multi-quantum well layer 305 and the p-type AlGaN layer 306. The InGaN/GaN multi-quantum well layer 305 includes an InGaN layer 305a, a layered structure 305b formed on the InGaN layer 305a, and an InGaN layer 305c formed on the layered structure 305b. The layered structure 305b includes layers of GaN/InGaN/GaN/InGaN . . . /GaN/InGaN/GaN.

Figure 4:
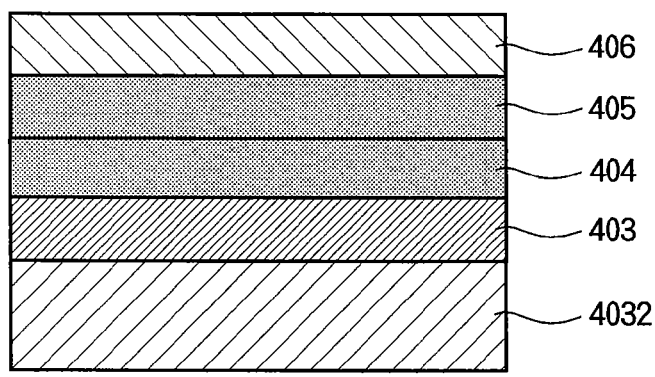
FIG. 4 is a sectional view of a second example of an element structure applicable to the composite semiconductor light-emitting device of the first embodiment of the present invention.

FIG. 4 shows a semiconductor layered structure (including the light-emitting regions) formed by layering an n-type GaN layer 402, an n-type $Al_xGa_{1-x}As$ layer 403, an $Al_yGa_{1-y}As$ layer 404, a p-type $Al_zGa_{1-z}As$ layer 405, and p-type GaN layer 406. In relation to FIG. 2, the first light-emitting layer 110b or the second light-emitting layer 110e of FIG. 2 corresponds to the layered structure of the n-type $Al_xGa_{1-x}As$ layer 403, the $Al_yGa_{1-y}As$ layer 404 and the p-type $Al_zGa_{1-z}As$ layer 405.

Figure 5:
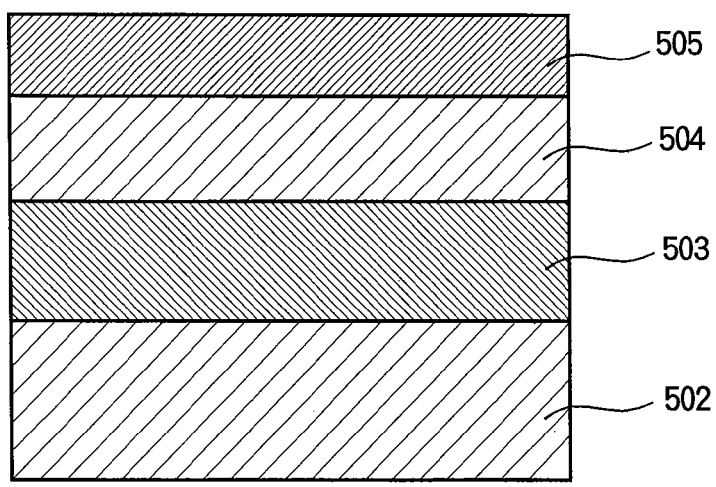
FIG. 5 is a sectional view of a third example of an element structure applicable to the composite semiconductor light-emitting device of the first embodiment of the present invention.

FIG. 5 shows a semiconductor layered structure (including the light-emitting regions) formed by layering an n-type GaN layer 502, a Zn-doped or Si-doped GaN layer 503, a Mg-doped p-type AlGaN layer 504 and a Mg-doped p-type GaN layer 505. In relation to FIG. 2, the first light-emitting layer 110b or the second light-emitting layer 110e of FIG. 2 corresponds to the layered structure of the Zn-doped or Si-doped GaN layer 503 and the Mg-doped p-type AlGaN layer 504.

Figure 6:
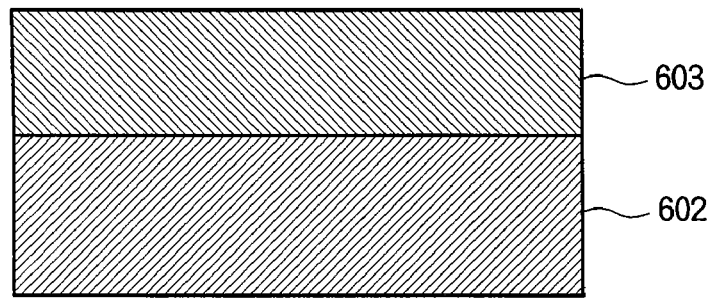
FIG. 6 is a sectional view of a fourth example of an element structure applicable to the composite semiconductor light-emitting device of the first embodiment of the present invention.

FIG. 6 shows a semiconductor layered structure formed by layering an n-type GaN layer 602 and a p-type GaN layer 603. In relation to FIG. 2, the first light-emitting layer 110b or the second light-emitting layer 110e of FIG. 2 corresponds to the layered structure of the n-type GaN layer 602 and the p-type GaN layer 603.

Next, other examples of the structure of GaAs-based layers will be described with reference to FIGS. 7 through 10.

Figure 7:
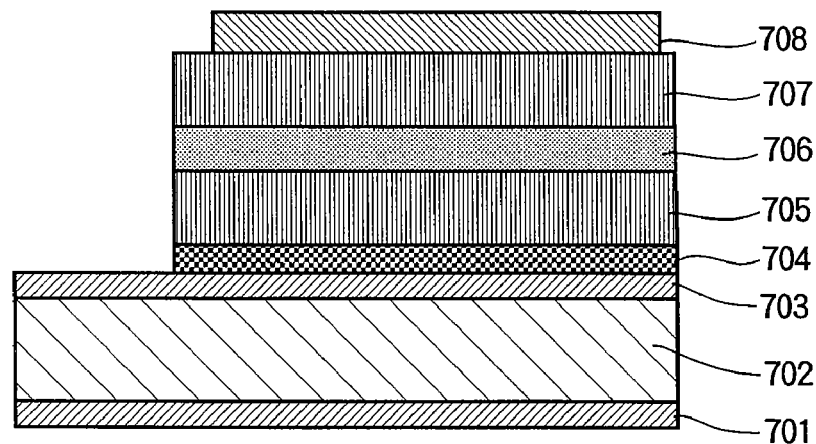
FIG. 7 is a sectional view of a fifth example of an element structure applicable to the composite semiconductor light-emitting device of the first embodiment of the present invention.

FIG. 7 shows a semiconductor layered structure formed by layering an n-type GaAs layer 701, an n-type layer 702, an n-type GaAs layer 703, an $In_rGa_{1-r}P$ layer 704, an n-type $Al_xGa_{1-x}As$ layer 705, an n-type $Al_yGa_{1-y}As$ layer 706, a p-type $Al_zGa_{1-z}As$ layer 707, and a p-type GaAs layer 708 (x, $z \geq y$ and $0 \leq y$, $r \leq 1$). In relation to FIG. 2, the second semiconductor element portion 130 of FIG. 2 corresponds to the layered structure of the layers 701 through 708 of FIG. 7.

Figure 8:
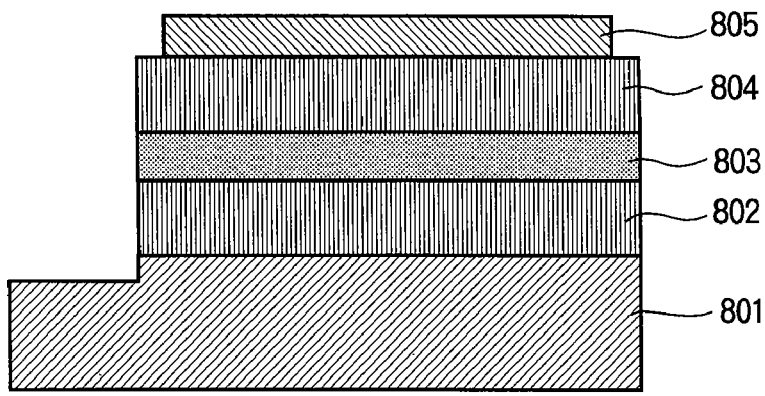
FIG. 8 is a sectional view of a sixth example of an element structure applicable to the composite semiconductor light-emitting device of the first embodiment of the present invention.

FIG. 8 shows a semiconductor layered structure formed by layering an n-type GaAs layer 801, an n-type $Al_xGa_{1-x}As$ layer 802, an n-type $Al_yGa_{1-y}As$ layer 803, a p-type $Al_zGa_{1-z}As$ layer 804 and a p-type GaAS layer 805 (x, $z \geq y$ and $0 \leq y \leq 1$). In relation to FIG. 2, the second semiconductor element portion 130 of FIG. 2 corresponds to the layered structure of the layers 801 through 805 of FIG. 8.

Figure 9:
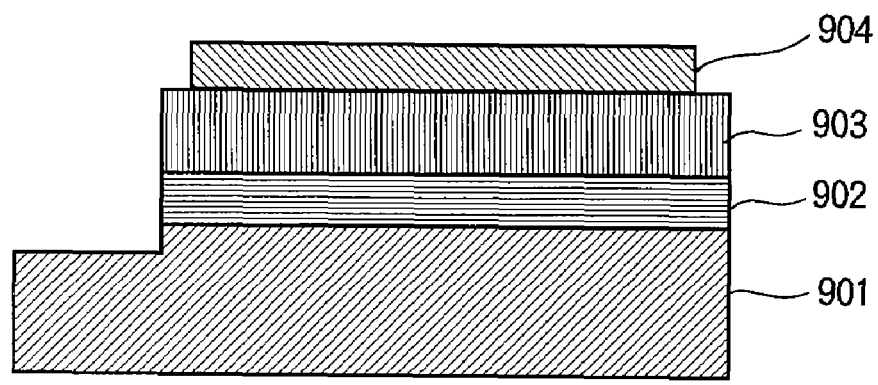
FIG. 9 is a sectional view of a seventh example of an element structure applicable to the composite semiconductor light-emitting device of the first embodiment of the present invention.

FIG. 9 shows a semiconductor layered structure formed by layering an n-type GaAs layer 901, an n-type $Al_yGa_{1-y}As$ layer 902, a p-type $Al_zGa_{1-z}As$ layer 903 and a p-type GaAs layer 904 ($z \geq y$ and $0 \leq y \leq 1$). In relation to the semiconductor layered structure shown in FIG. 2, the second semiconductor element portion 130 of FIG. 2 corresponds to the layered structure of the layers 901 through 904 of FIG. 9.

Figure 10:
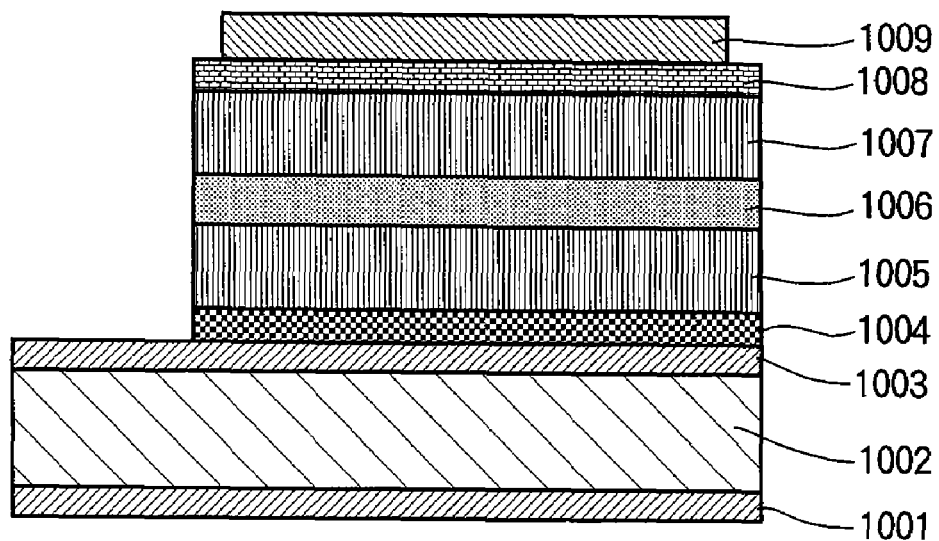
FIG. 10 is a sectional view of a tenth example of an element structure applicable to the composite semiconductor light-emitting device of the first embodiment of the present invention.

FIG. 10 shows a semiconductor layered structure made of AlGaInP-based materials. The semiconductor layered structure of FIG. 10 includes an n-type GaAs layer 1001, an n-type $Al_sGa_{1-s}As$ or n-type $(Al_sGa_{1-s})_uIn_{1-u}As$ conductive layer 1002, an n-type GaAs contact layer 1003, an $In_vGa_{1-v}P$ etching stopper layer 1004, an n-type AlGaInP cladding layer 1005, a GaInP active layer 1006, a p-type AlGaInP cladding layer 1007, a p-type GaInP layer 1008 and a p-type GaAs layer 1009. In relation to FIG. 2, the second semiconductor element portion 130 of FIG. 2 corresponds to the structure of the layers 1001 through 1009 of FIG. 10.

In the semiconductor layered structure shown in FIG. 10, the light-emitting region (i.e., the n-type AlGaInP cladding layer 1005, the GaInP active layer 1006 and the p-type AlGaInP cladding layer 1007) can be of lattice-matched hetero-layered structure such as $Ga_{0.5}In_{0.5}P/(Al_xGa_{1-x})_{0.5}P$, or strained $Ga_xIn_{1-x}P$ quantum structure. Further, the light-emitting region can be of single quantum well (SQW) structure, or multi-quantum well (MQW) structure. In the lattice-matched structure, the mixed crystal ratio can deviate from the ideal value (i.e., 0.5). For example, $Ga_{0.52}In_{0.48}P$ can be used. In the above described examples, the semiconductor layered structure can be appropriately modified.

The semiconductor layered structures of the above described materials have thin-film structures. The semiconductor layered structure can be formed by forming a releasing layer on a substrate, layering the semiconductor epitaxial layers of the respective composition to grow the epitaxial semiconductor layered structure, removing the releasing layer by means of an etching solution (that selectively causes the releasing layer to solve), and separating the semiconductor layered structure from the substrate. The thickness of the semiconductor layered structure is preferably less than or equals to 10 μm, and more preferably less than or equals to 2 μm. With such a thickness, the height of each layer can be reduced, and therefore the disconnection of the wirings can be prevented.

In the composite semiconductor light-emitting device according to the first embodiment, three kinds of light-emitting regions are electrically connected in series with each other. By allowing the current to flow between the n-side electrode pad 141 and the p-side electrode pad 143, the first, second and third light-emitting regions are activated to emit light.

In the above described first embodiment, GaN-based semiconductor emits the light whose wavelength is relatively short (i.e., blue and green), the GaAs-based semiconductor emits the light whose wavelength is relatively long (i.e., red) that is difficult for the GaAs-based semiconductor to emit, and the semiconductors are bonded to each other. Therefore, it becomes possible to obtain the lights whose wavelengths are suitable for the respective semiconductors. By combining the lights of the primary colors, it becomes possible to obtain the light of the preferable color (for example, white light) of high intensity.

That is, in the composite semiconductor light-emitting device of the first embodiment of the present invention, a first semiconductor element portion 110 (that emit the lights of a plurality of wavelengths) made of the layered structure of the semiconductor materials of the same group, and a second semiconductor element portion 130 made of the layered structure of the different semiconductor materials are integrated. Therefore, it becomes possible to obtain the composite semiconductor light-emitting device (that emits the lights of a plurality of wavelengths) which occupies less space and which is excellent in controllability of light-emission property or color, and the combination of the wavelengths of the lights is not limited by lattice-constant or heat expansion coefficient of the materials.

Further, in the first embodiment, the second semiconductor element portion 130 (of the GaAs-based layers) is bonded onto the first semiconductor element portion 110 (of the GaN-based layers) via the dielectric layer 140. However, the second semiconductor element portion 130 can be directly bonded onto the first semiconductor element portion 110. Alternatively, the second semiconductor element portion 130 can be bonded onto the first semiconductor layer 110 via a metal layer. By bonding the second semiconductor element portion 130 (of the GaAs-based layers) to the first semiconductor element portion 140 (of the GaN-based layers) directly or via metal layer, it becomes unnecessary to connect the metal wiring 107 to both of the p-type GaN layer 110f and the n-type GaAs layer 130b. In such a case, it is possible to connect the metal wiring 107 to one of the p-type GaN layer 110f and the n-type GaAs layer 130b.

As described above, the semiconductor light-emitting device (in which the light-emitting regions corresponding to the plurality of colors are integrated) can be configured to emit the lights of desired wavelengths at desired intensities. Therefore, the semiconductor light-emitting device can be employed in various kinds of lighting devices such as a white backlight or flashlight. In this regard, if the conventional light-emitting device (LED) that emits the light of long wavelength is used in combination with a fluorescent coating, the light emitted by the LED is absorbed by the fluorescent coating and converted into the light of different wavelength, and therefore the conversion efficiency is low and the output intensity is reduced to a large extent. However, according to the first embodiment of the present invention, the lights of the desired wavelengths are directly emitted, and therefore the white light of high intensity can be emitted.

In the composite semiconductor light-emitting device according to the first embodiment of the present invention, the combination of the lights emitted by the respective light-emitting regions is not limited to the combination that produces white light. It is also possible to produce light of various colors for many purposes, by selecting the wavelengths and the intensities of the lights.

Modifications may be made to the first embodiment of the present invention in terms of material and structure. The modifications will be described hereinafter.

Figure 11:
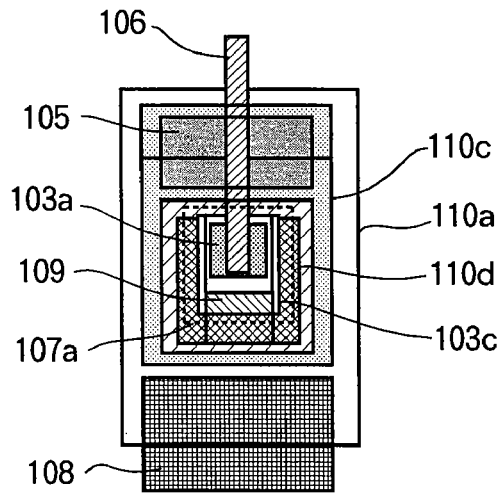
FIG. 11 is a plan view of a modification of electrodes and wirings of the composite semiconductor light-emitting device of the first embodiment of the present invention.
Figure 12:
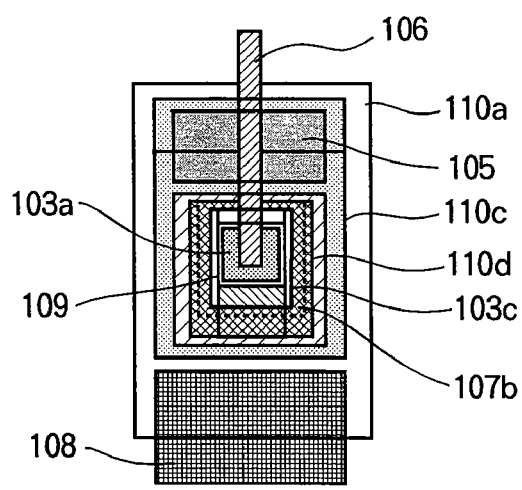
FIG. 12 is a plan view of another modification of electrodes and wirings of the composite semiconductor light-emitting device of the first embodiment of the present invention.

FIGS. 11 and 12 are plan views showing modifications to arrangements of the electrodes and the wirings. In FIGS. 11 and 12, the modification is made to the wiring 107 electrically connecting the first semiconductor element portion 110 and the second semiconductor element portion 130. In an example shown in FIG. 11, a wiring 107a is configured to form three sides of a rectangle, and electrically connects the first semiconductor element portion 110 and the second semiconductor element portion 130. In another example shown in FIG. 12, a writing 107b is configured to form four sides of a rectangle, and electrically connects the first semiconductor element portion 110 and the second semiconductor element portion 130. With such configurations, it becomes possible to prevent the concentration of the current in the vicinity of the electrode, and therefore the distribution of the light emitted from the second semiconductor element portion 130 becomes uniform.

Figure 13:
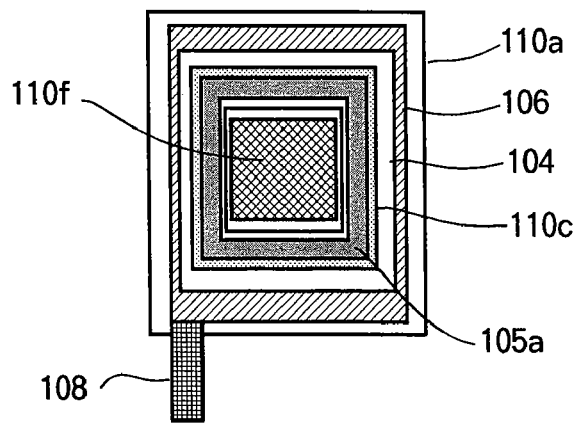
FIG. 13 is a plan view of still another modification of electrodes and wirings of the composite semiconductor light-emitting device of the first embodiment of the present invention.
Figure 14:
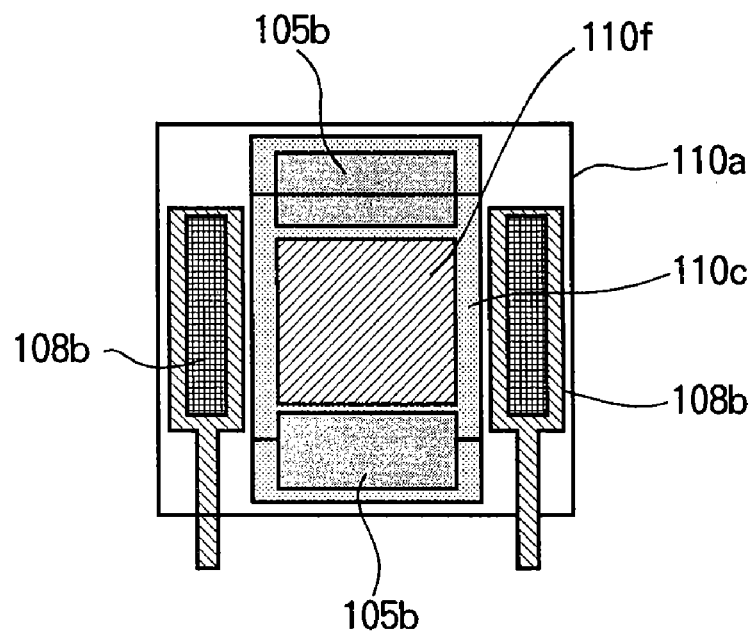
FIG. 14 is a plan view of yet another modification of electrodes and wirings of the composite semiconductor light-emitting device of the first embodiment of the present invention.
Figure 15:
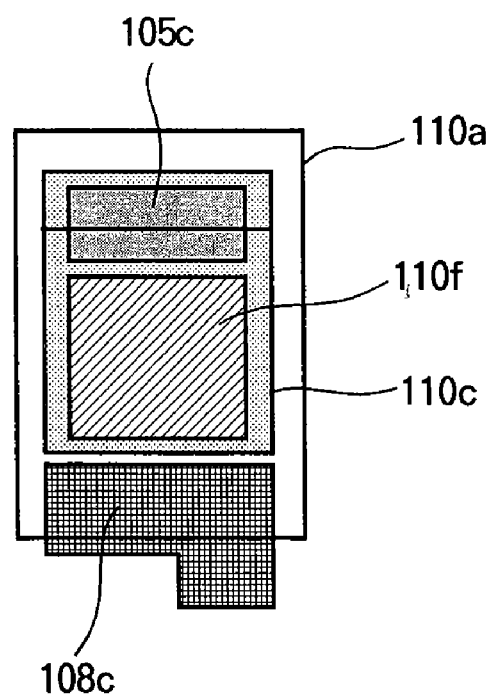
FIG. 15 is a plan view of a further modification of electrodes and wirings of the composite semiconductor light-emitting device of the first embodiment of the present invention.

FIGS. 13 through 15 are plan views showing the modifications of the wiring that electrically connects the first light-emitting region and the second light-emitting region. In an example shown in FIG. 13, a wiring 105a connecting two light-emitting regions of the first semiconductor element portion 110 is configured to surround the rectangular first and second semiconductor element portions 110 and 130 on four sides. With such a configuration, it becomes possible to prevent the concentration of the current in the vicinity of the electrode, and therefore the distribution of the light emitted from the first semiconductor element portion 110 becomes uniform.

In an example shown in FIG. 14, a pair of wirings 105b that electrically connect two light-emitting regions of the first semiconductor element portion 110 are disposed on two opposing sides of a rectangle. A pair of wirings 108b that electrically connect the n-side electrode pad 141 and the n-type GaN layer 110a of the first semiconductor element portion 110 are disposed on the other two opposing sides of the rectangle. With such a layout, the current is allowed to flow through the first semiconductor element portion 110 in a symmetrical manner, and it becomes possible to prevent the concentration of the current in the vicinity of the electrode. Therefore, the distribution of the light emitted from the first semiconductor element portion 110 becomes uniform.

In an example shown in FIG. 15, a wiring 105c that electrically connects two light-emitting regions of the first semiconductor element portion 110 is disposed on one side of a rectangular. A wiring 108c that electrically connect the n-side electrode pad 141 and the n-type GaN layer 110a of the first semiconductor element portion 110 is disposed on the opposite side of the rectangular. With such a layout, the current is allowed to flow through the first semiconductor element portion 110 in a symmetrical manner, and it becomes possible to prevent the concentration of the current in the vicinity of the electrode. Therefore, the distribution of the light emitted from the first semiconductor element portion 110 becomes uniform.

Furthermore, it is also possible to provide a metal layer below the second semiconductor element portion 130, i.e., on the top of the first semiconductor element portion 110 or below the second dielectric layer 140, for enhancing the effect of the reflection of the light in the third light-emitting region. With such a configuration, it is possible to increase the intensity of the light emitted from the third light-emitting region. Moreover, a part of the light emitted by the first and second light-emitting regions is reflected by the metal layer on the top of the first semiconductor element portion 110, and further reflected by the metal layer 102 at the bottom of the first semiconductor element portion 110 (or the reflection of the light is repeated), and therefore the intensity of the light emitted from the top of the device can be enhanced.

In the above described first embodiment, the second semiconductor element portion (i.e., second semiconductor layered structure) 130 has been described to include one light-emitting region. However, it is also possible to configure the second semiconductor element portion 130 to include a plurality of light-emitting regions, and to connect the respective light-emitting regions in series with each other as in the first semiconductor element portion (i.e., first semiconductor layered structure) 110. With such an arrangement, it becomes possible to increase the amount of the light emitted by the second semiconductor element portion 130.

Besides the above described semiconductor materials, it is also possible to use one of or any combination of the following nitride-based semiconductor materials: $GaAs_{1-x-y}As_xN_x$, $GaP_{1-x}N_x$, $InAs_{1-x}N_x$, $InGa_{1-x}As_{1-y}N_y$, $InP_{1-x-y}As_xN_y$, $GaP_{1-x-y}As_xN_y$, $In_xAl_{1-x}N$ ($1 \geq x \geq 0$, and $1 \geq y \geq 0$). Further, it is also possible to use quarternary material such as $Al_x$ $Ga_yAs_{1-x-y}P$, $Al_xGa_yIn_{1-x-y}P$ or the like. It is also possible to use II-VI compound semiconductor materials, or oxide semiconductor material such as ZnO.

The substrate 101 can be made of quarts, glass, metal, organizing material such as PET (Poly-Ethylene-Terephthalate) or PI (Polyimide), semiconductor such as Si or SiC, ceramic or other various kinds of material. The substrate 101 can be a thick plate, or a thin plate having a flexibility.

Second Embodiment

Figure 16:
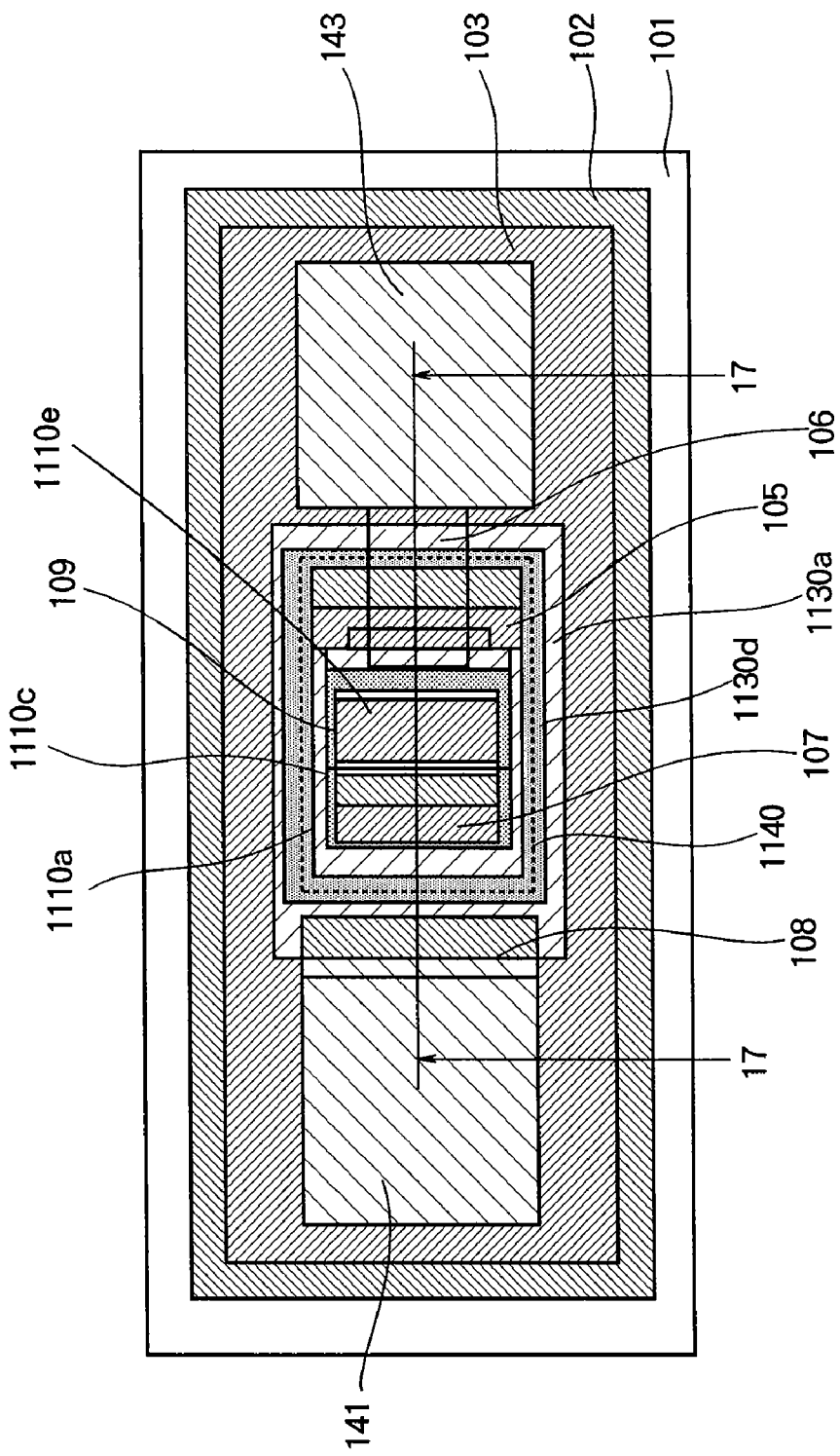
FIG. 16 is a plan view of a composite semiconductor light-emitting device according to the second embodiment of the present invention.
Figure 17:
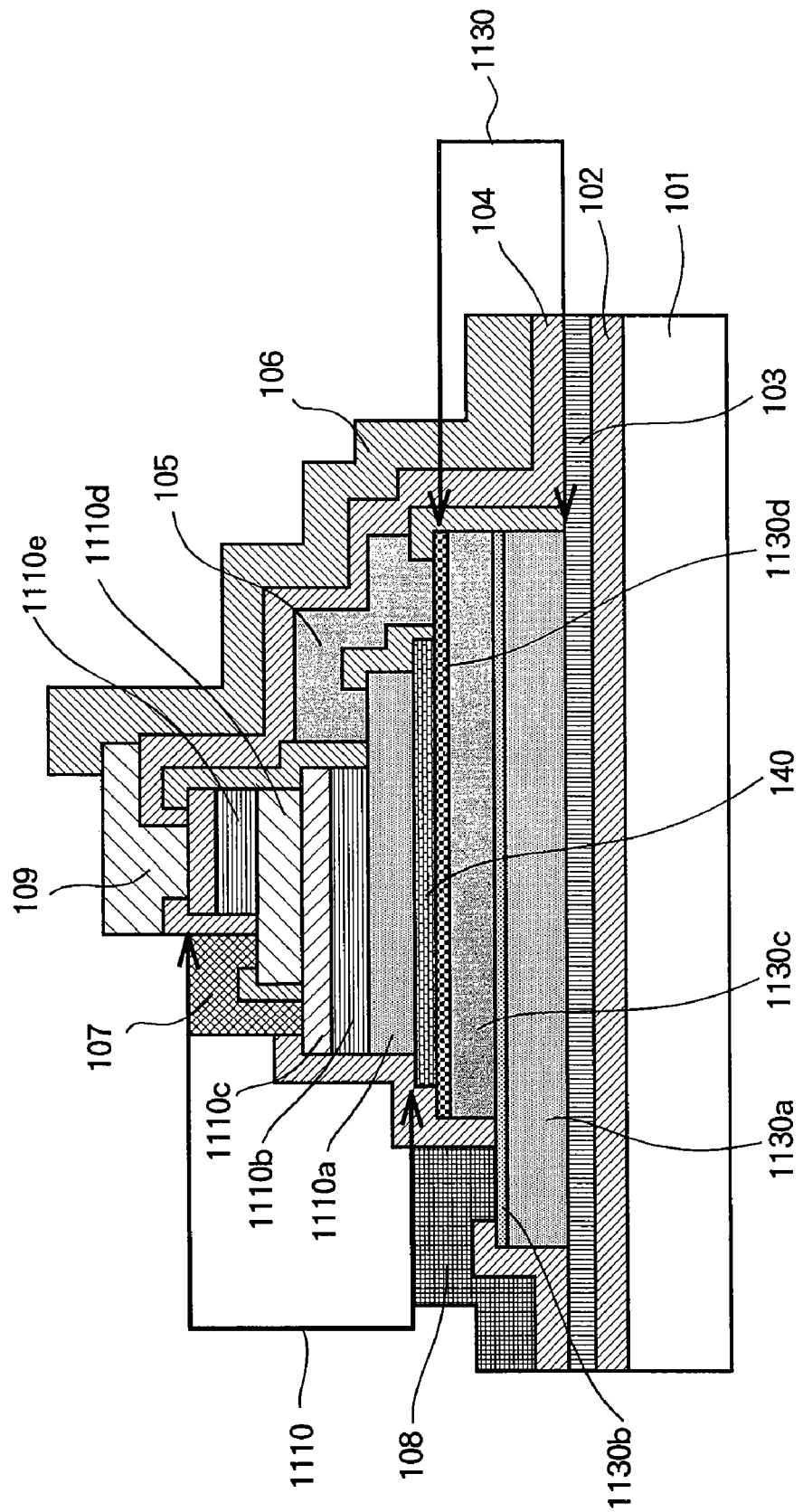
FIG. 17 is a sectional view of the composite semiconductor light-emitting device according to the second embodiment of the present invention, taken along line 17-17 in FIG. 16.

FIG. 16 is a plan view schematically showing a composite semiconductor light-emitting device according to the second embodiment of the present invention. FIG. 17 is a sectional view taken along line 17-17 in FIG. 16. The second embodiment is different from the first embodiment in that a first semiconductor element portion 1110 is formed on a second semiconductor element portion 1130. Here, the description is focused on features of the second embodiment different from the first embodiment.

As shown in FIG. 17, in the composite semiconductor light-emitting device of the second embodiment, the second semiconductor element portion 1130 (having the third light-emitting region) is formed below the first semiconductor element portion 1110 (having the first and second light-emitting regions). The second semiconductor element portion 1130 is made of GaAs-based semiconductor materials. In particular, an n-type $Al_xGa_{1-x}As$ layer 1130a is formed on the dielectric layer 103, an n-type GaAs layer 1130b is formed on the $Al_xGa_{1-x}As$ layer 1130b, and a third light-emitting layer 1130c (including an n-type $Al_yGa_{1-y}As$ cladding layer, an n-type $Al_zGa_{1-z}As$ active layer and a p-type $Al_tGa_{1-t}As$ cladding layer) is formed on the n-type GaAs layer 1130b. A p-type GaAs layer 1130d is formed on the third light-emitting layer 1130c.

The first semiconductor element portion 1110 is formed on the second semiconductor element portion 1130 made of GaAs-based materials. The first semiconductor element portion 1110 is made of nitride compound semiconductor material, and has the first and second light-emitting regions that emit lights of different wavelengths. To be more specific, an n-type GaN layer 1110a is formed on the interlaminar dielectric layer 140, and a first light-emitting layer 1110b (including a GaInN/GaN multi-quantum well layer and a p-type AlGaN layer) is formed on the N-type GaN layer 1110a. A p-type GaN layer 1110c is formed on the first light-emitting layer 1110b. The layers 1110a, 1110b and 1110c constitute a first light-emitting region, on which a second light-emitting region is formed. The second light-emitting region includes an n-type GaN layer 1110d, a second light-emitting layer 1110e (including a GaInN/GaN multi-quantum well layer and a p-type AlGaN layer) formed on the n-type GaN layer 1110d, and a p-type GaN layer 1110f formed on the second light-emitting layer 1110e. InN mole fraction of the second light-emitting layer 1110e is smaller than that of the first light-emitting layer 1110b.

The plurality of light-emitting regions are electrically connected in series with each other as was described in the first embodiment. It is also possible to use the respective semiconductor layered structures and respective light-emitting regions described in the first embodiment. Further, it is possible to employ the modifications described in the first embodiment.

In the second embodiment, the wavelength of the light emitted by the third light-emitting region of the second semiconductor element portion 1130 can be set longer than the wavelengths of the lights emitted by the first and second light-emitting regions of the first semiconductor element portion 1110. With such an arrangement, the light emitted upward from the second semiconductor element portion 1130, the light emitted downward from the second semiconductor element portion 1130 and reflect upward at the bottom (i.e., the metal layer 102), and the light repeatedly reflected between the top and bottom and finally directed upward are not absorbed by the first semiconductor element portion 1110 when the lights pass the first semiconductor element portion 1110. Therefore, the intensity of the light emitted by the second semiconductor element portion 1130 can be increased relative to the light emitted by the first semiconductor element portion 1110.

According to the second embodiment of the present invention, the second semiconductor element portion 1130 having the third light-emitting region is formed below the first semiconductor element portion 1110 having the first and second light-emitting regions. Accordingly, the light emitted upward from the second semiconductor element portion 1130, the light emitted downward from the second semiconductor element portion 1130 and reflect upward at the bottom, and the light repeatedly reflected between the top and bottom and finally directed upward are not absorbed by the first semiconductor element portion 1110 when the lights pass the first semiconductor element portion 1110, and therefore the intensity of the light emitted by the second semiconductor element portion 1130 can be increased relative to the light emitted by the first semiconductor element portion 1110.

Third Embodiment

Figure 18:
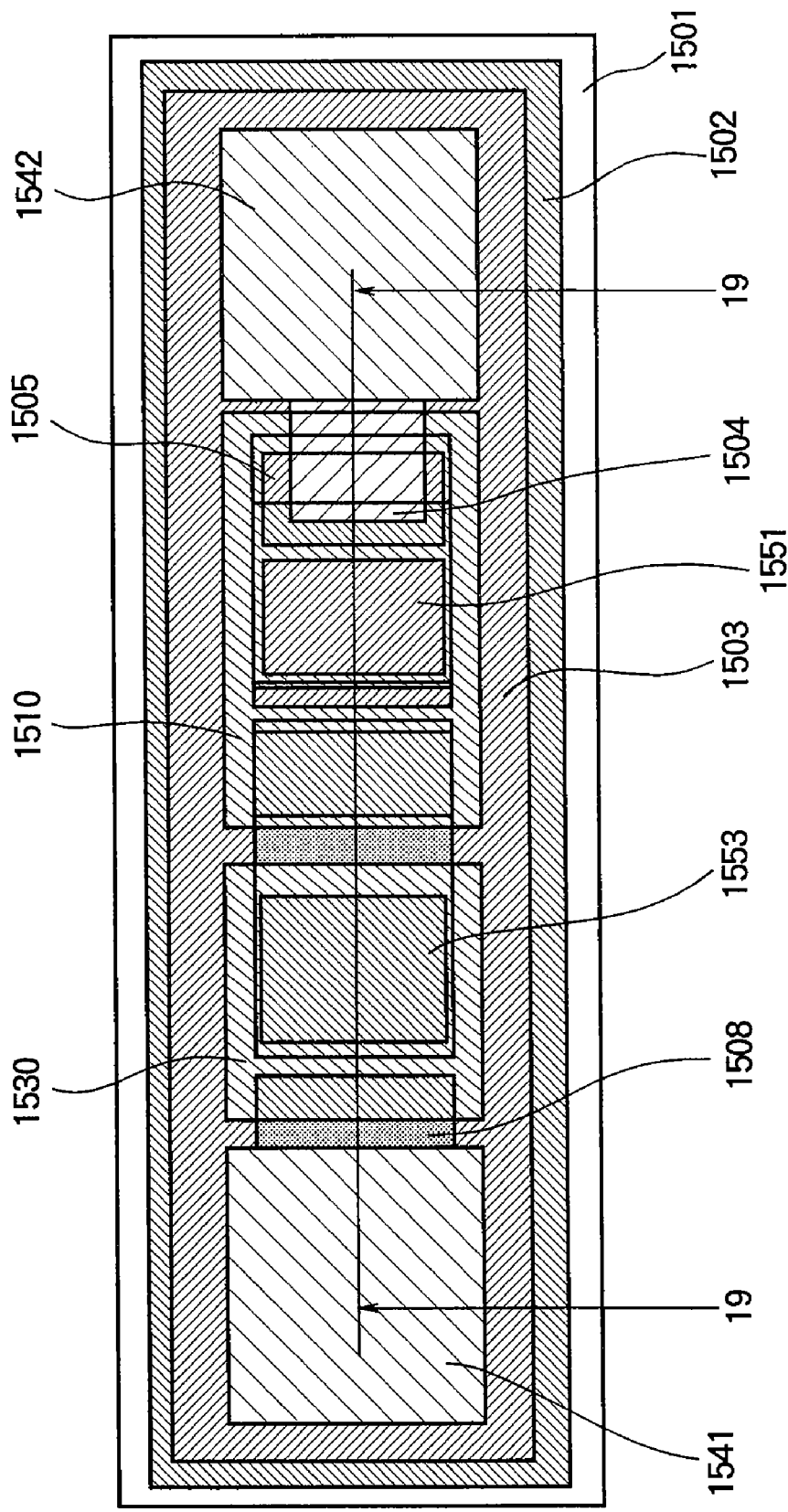
FIG. 18 is a plan view of a composite semiconductor light-emitting device according to the third embodiment of the present invention.
Figure 19:
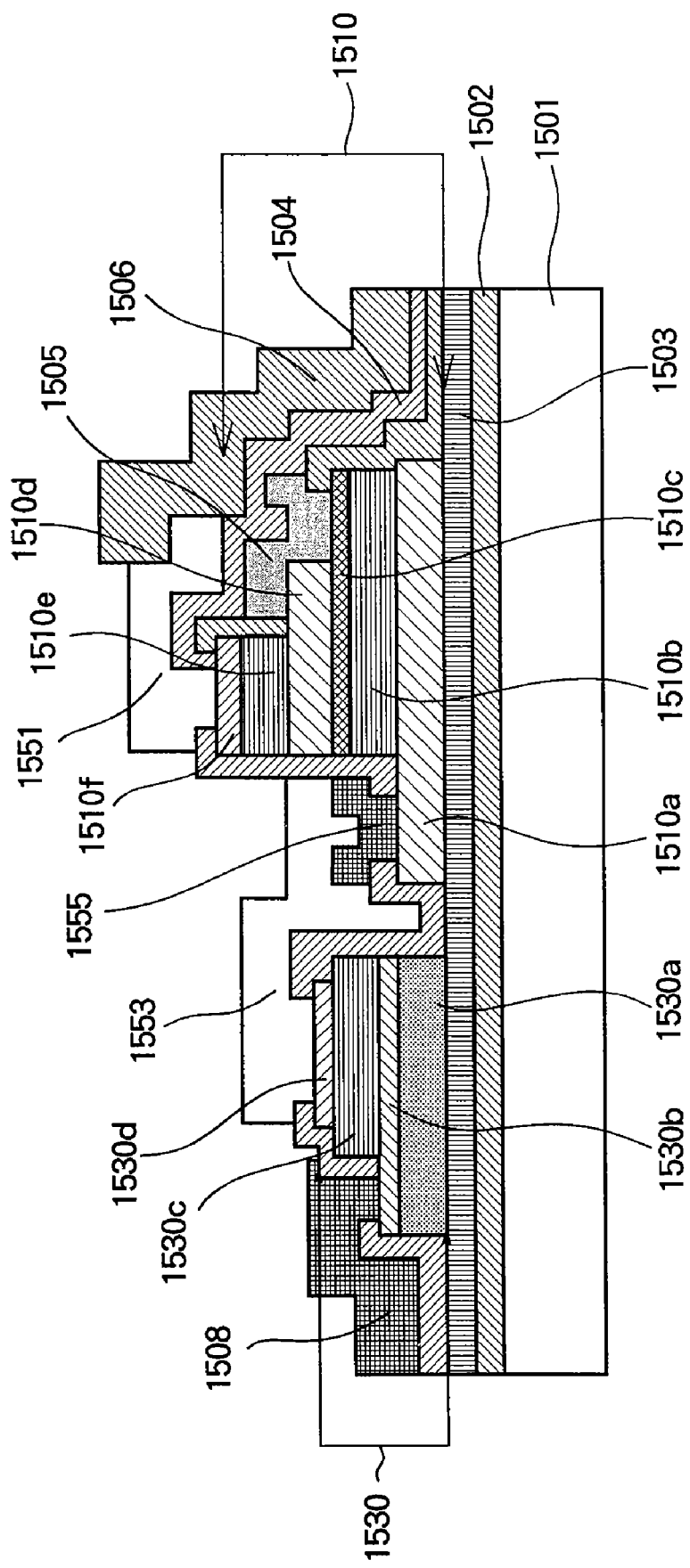
FIG. 19 is a sectional view of the composite semiconductor light-emitting device according to the third embodiment of the present invention, taken along line 19-19 in FIG. 18.

FIG. 18 is a plan view schematically showing a composite semiconductor light-emitting device according to the third embodiment of the present invention. FIG. 19 is a sectional view taken along line 19-19 in FIG. 18. The composite semiconductor light-emitting device of the third embodiment is different from that of the first embodiment in that a first semiconductor element portion 1510 and a second semiconductor element portion 1530 are bonded onto different regions in layout.

The light-emitting regions of the first semiconductor element portion 1510 and the light-emitting region of the second semiconductor element portion 1530 are electrically connected in series with each other. Here, the description is focused on features of the third embodiment different from the first and second embodiments.

As shown in FIG. 18, the first semiconductor element portion 1510 and the second semiconductor element portion 1530 are bonded onto the regions adjacent to each other. A reflection metal layer 1502 is formed on a substrate 1501. A dielectric film 1503 is formed on the reflection metal layer 1502, and the first and second semiconductor element portions 1510 and 1530 are formed on the dielectric film 1503. Electrodes 1551 and 1553 are formed on the tops of the respective semiconductor element portions 1510 and 1530. The electrodes 1551 and 1553 are made of transparent conductive materials in order to obtain a high efficiency of the light emission. The light-emitting regions of the respective semiconductor element portions 1510 and 1530 are connected in series with each other by means of wirings 1505, 1555, 1553 and 1508. The wiring 1505 is electrically connected to a p-side electrode pad 1542, and the wiring 1508 is electrically connected to an n-side electrode pad 1541.

The first semiconductor element portion 1510 and the second semiconductor element portion 1530 can be formed of the structure and materials described in the first embodiment. To be more specific, as shown in FIG. 19, an n-type GaN layer 1510a is formed on the dielectric layer 1503, and a first light-emitting layer 1510b (including a GaInN/GaN multi-quantum well layer and a p-type AlGaN layer) is formed on the N-type GaN layer 1510a. A p-type GaN layer 1510c is formed on the first light-emitting layer 1510b. The layers 1510a, 1510b and 1510c constitute a first light-emitting region, on which a second light-emitting region is formed. The second light-emitting region includes an n-type GaN layer 1510d, a second light-emitting layer 1510e (including a GaInN/GaN multi-quantum well layer and a p-type AlGaN layer) formed on the n-type GaN layer 1510d, and a p-type GaN layer 1510f formed on the second light-emitting layer 1510e. InN mole fraction of the second light-emitting layer 1510e is smaller than that of the first light-emitting layer 1510b.

The second semiconductor element portion 1530 is made of GaAs-based semiconductor materials. To be more specific, an n-type $Al_xGa_{1-x}As$ layer 1530a is formed on the dielectric layer 1503, an n-type GaAs layer 1530b is formed on the $Al_xGa_{1-x}As$ layer 1530b, and a third light-emitting layer 1530c (including an n-type $Al_yGa_{1-y}As$ cladding layer, an n-type $Al_zGa_{1-z}As$ active layer and a p-type $Al_tGa_{1-t}As$ cladding layer) is formed on the n-type GaAs layer 1530b. A p-type GaAs layer 1530d is formed on the third light-emitting layer 1530c. Further, the modifications described in the first embodiment can be made to the arrangement of the electrodes and the electrode pads or the like.

The substrate 1501, the reflection metal layer 1502, and the first dielectric film 1503 of the third embodiment are respectively the same as the substrate 101, the reflection metal layer 102 and the first dielectric layer 103 of the first embodiment.

In the third embodiment of the present invention, the light-emitting regions of the first semiconductor element portion 1510 and the light-emitting region of the second semiconductor element portion 1530 are bonded onto different regions, and therefore the manufacturing process can be simplified. Further, the degrees of freedom in design of size and shape increase. Moreover, it becomes possible to remove the influence of the absorption of the light (according to the properties of the semiconductor materials of the respective semiconductor element portions 1510 and 1530), and therefore it becomes possible to enhance the properties, for example, the efficiency of light emission, the uniformity of the intensities of the lights, or the like.

Figure 20:
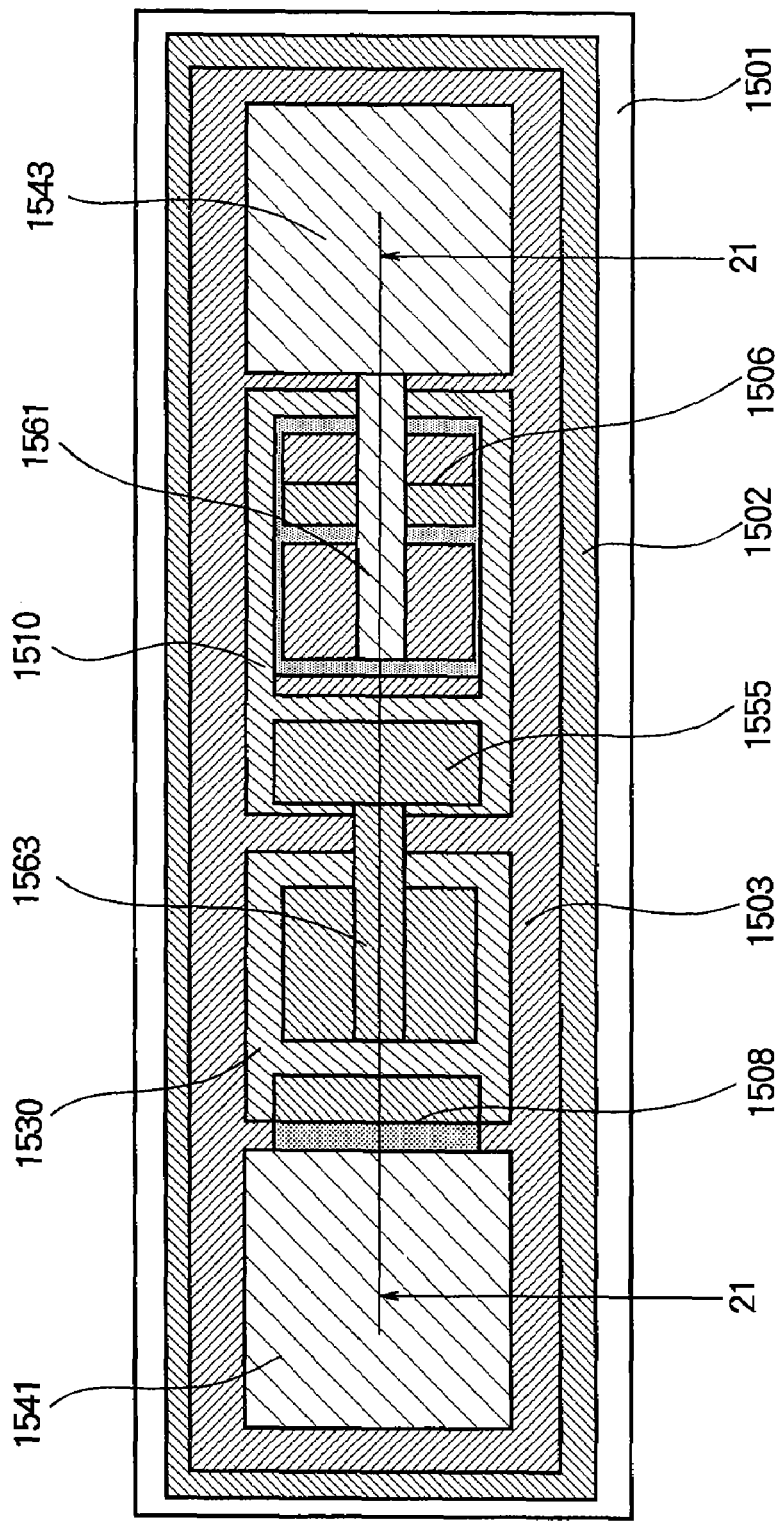
FIG. 20 is a plan view of a modification of the composite semiconductor light-emitting device of the third embodiment of the present invention.
Figure 21:
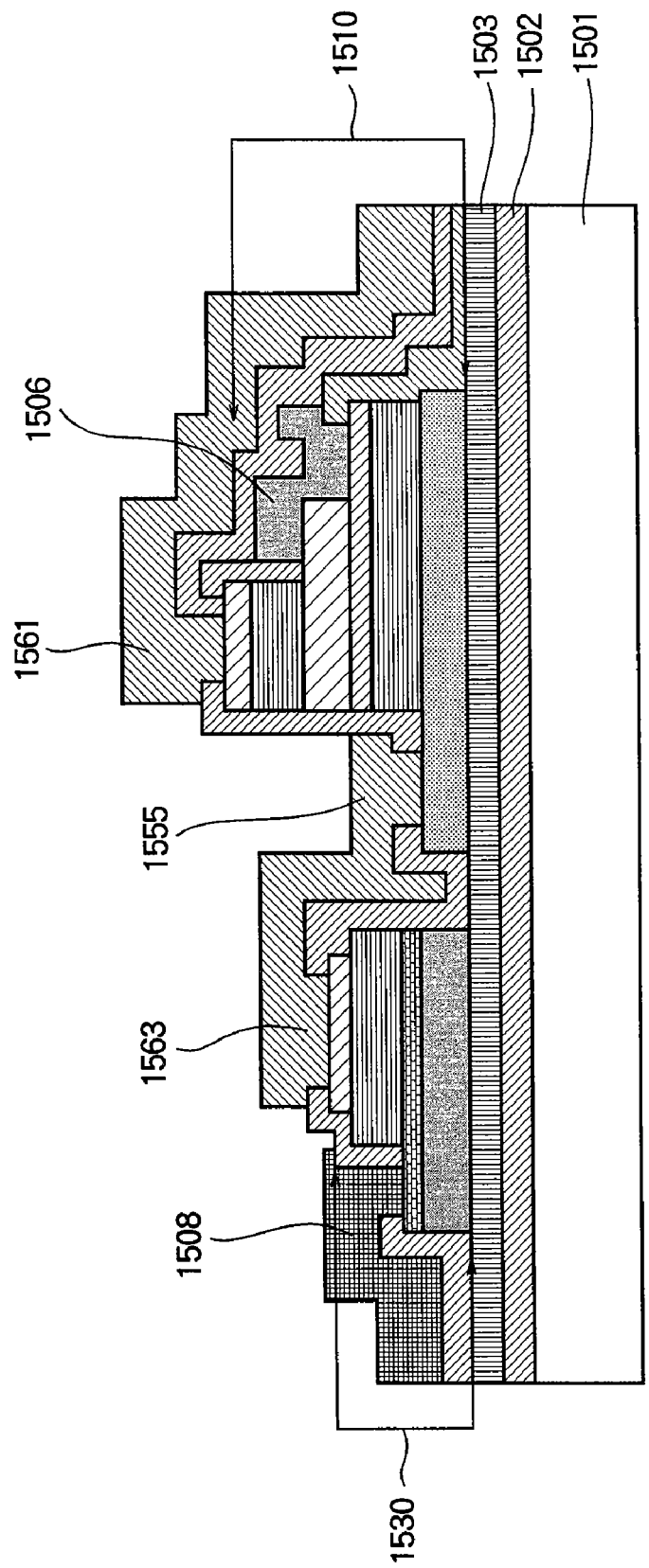
FIG. 21 is a sectional view of the composite semiconductor light-emitting device of FIG. 20, taken along line 21-21 in FIG. 20.

FIG. 20 is a plan view showing a modification of the composite semiconductor light-emitting device of the third embodiment. FIG. 21 is a sectional view taken along line 21-21 in FIG. 20. As shown in FIGS. 20 and 21, the transparent electrodes can be replaced by contact layers 1561 and 1563 respectively formed on the tops of the first and second semiconductor element portions 1510 and 1530. The contact layers 1561 and 1563 are made of metal. In this case, the contact layers 1561 and 1563 do not cover whole surfaces of the regions from which the lights are emitted, but partially open the surfaces of the regions through which the lights are emitted.

Figure 22:
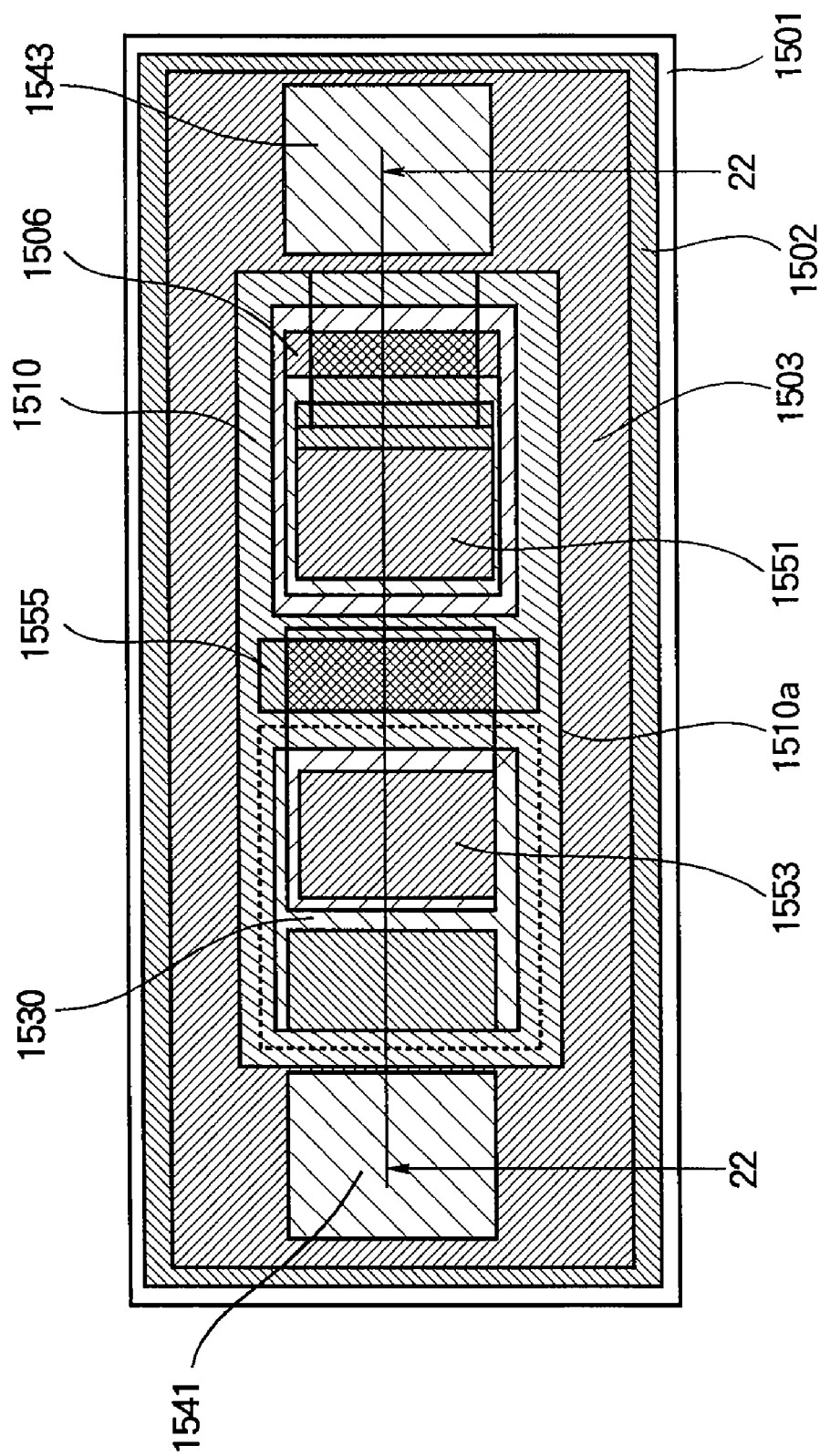
FIG. 22 is a plan view of another modification of the composite semiconductor light-emitting device of the third embodiment of the present invention.
Figure 23:
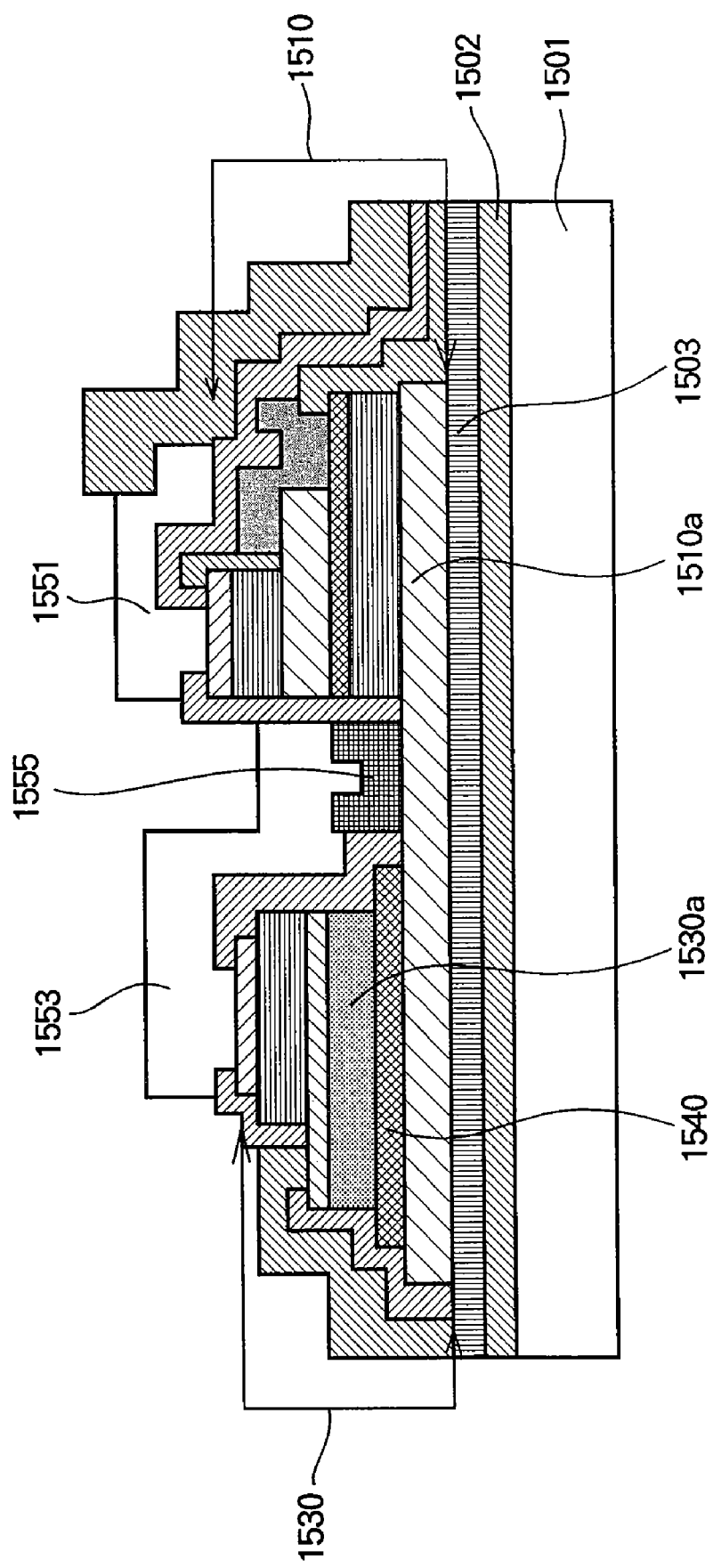
FIG. 23 is a sectional view of the composite semiconductor light-emitting device of FIG. 22.

FIG. 22 is a plan view showing another modification of the composite semiconductor light-emitting device of the third embodiment. FIG. 23 is a sectional view taken along line 23-23 in FIG. 22. As shown in FIGS. 22 and 23, the second semiconductor element portion 1530 can be bonded onto the semiconductor layer 1510a of the first semiconductor element portion 1510. In this case, a second dielectric film 1540 can be formed below the semiconductor layer 1530a of the second semiconductor element portion 1530.

Figure 24:
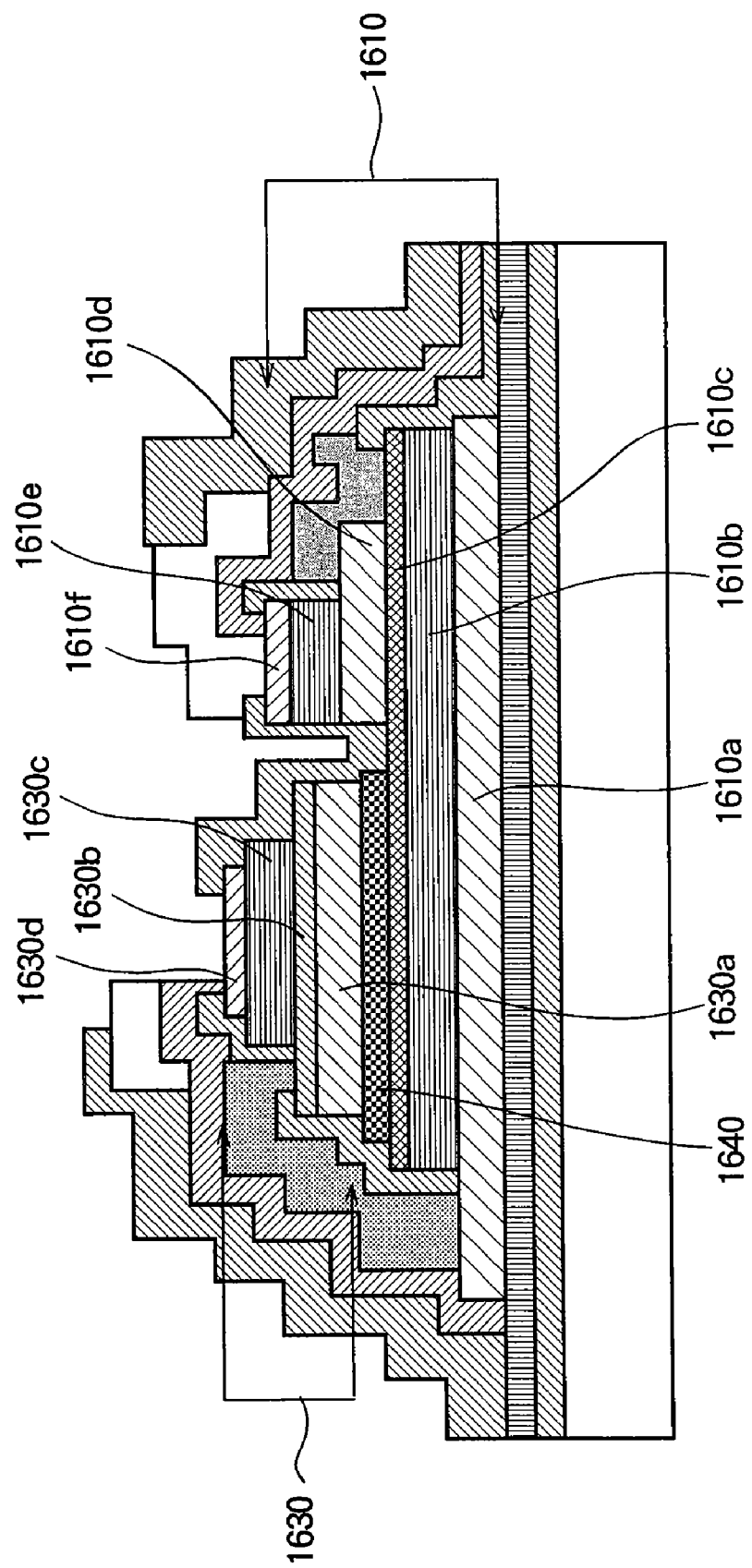
FIG. 24 is a plan view of a still another modification of the composite semiconductor light-emitting device of the third embodiment of the present invention.

FIG. 24 is a schematic view showing still another modification of the composite semiconductor light-emitting device of the third embodiment. As shown in FIG. 24, a first semiconductor element portion 1610 includes semiconductor layers 1610a, 1610b and 1610c (constituting a first light-emitting region), and semiconductor layers 1610d, 1610e and 1610f (constituting a second light-emitting region). A second semiconductor element portion 1630 includes semiconductor layers 1630a, 1630b, 1630c and 1630d. The semiconductor layers 1630a through 1630d of the second semiconductor element portion 1630 are layered, and bonded onto the semiconductor layers 1610a, 1610b and 1610c of the first semiconductor element portion 1610.

Figure 25:
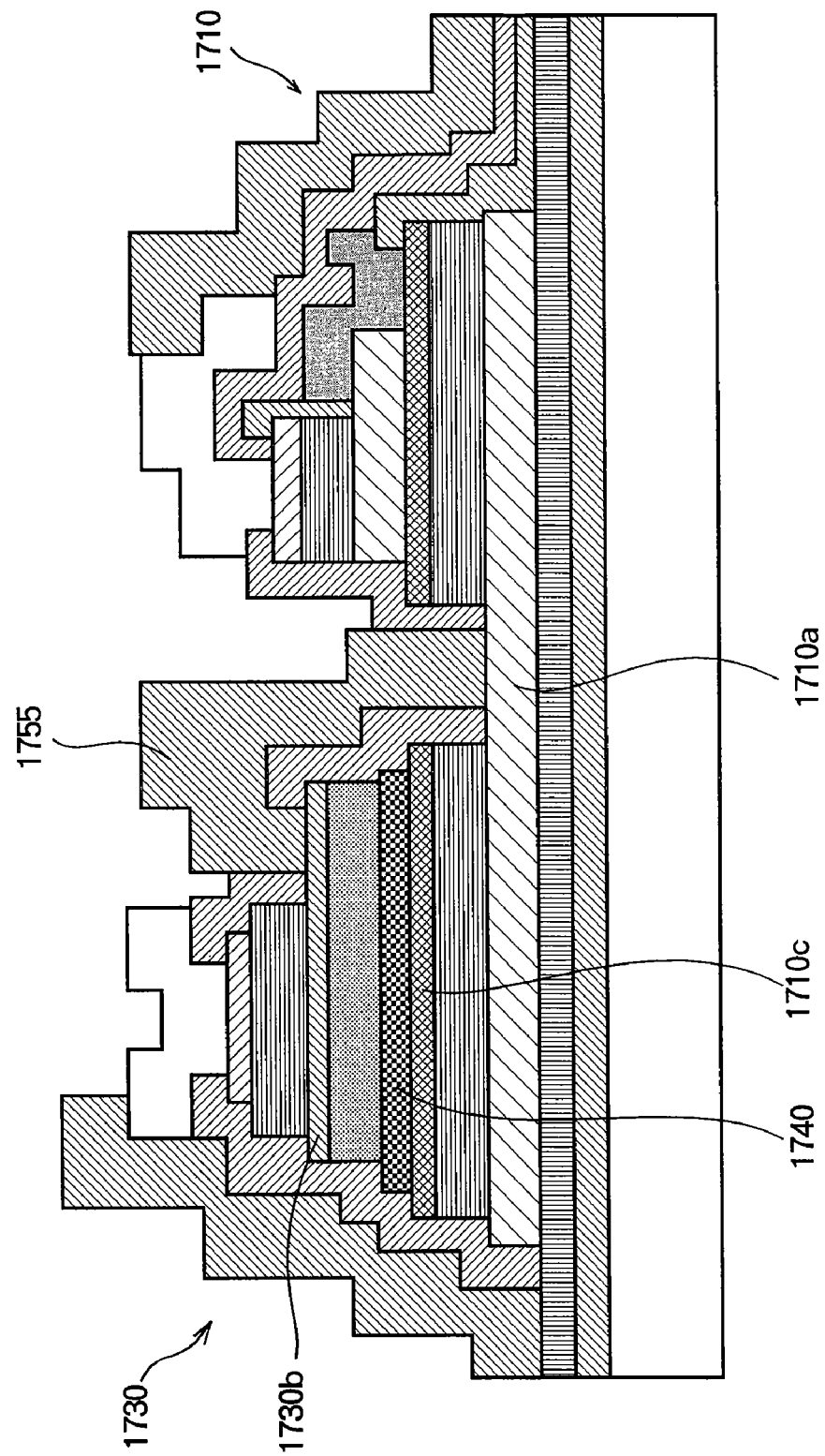
FIG. 25 is a plan view of yet another modification of the composite semiconductor light-emitting device of the third embodiment of the present invention.

FIG. 25 is a schematic view showing yet another modification of the composite semiconductor light-emitting device of the third embodiment. As shown in FIG. 25, a second semiconductor element portion 1730 is bonded onto a semiconductor layer 1710c of the first semiconductor element portion 1710 via a dielectric layer 1740 as described in the modification shown in FIG. 24. Further, in FIG. 25, a semiconductor layer 1710a of the first semiconductor element portion 1710 and a semiconductor layer 1730b of the second semiconductor element portion 1730 are electrically connected to each other via a metal wiring 1755.

Figure 26:
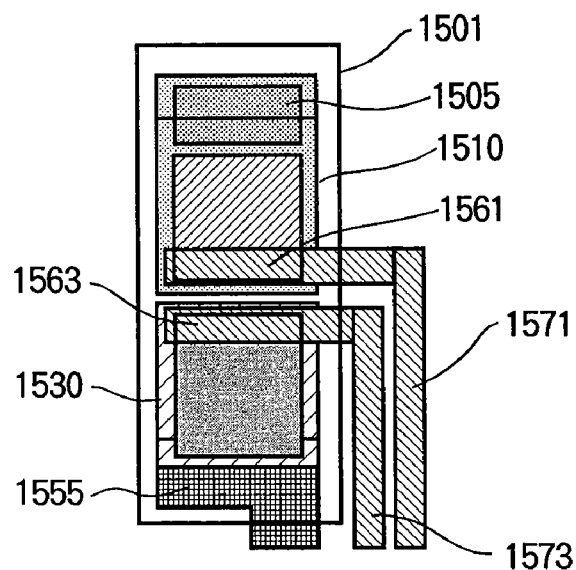
FIG. 26 is a plan view of a modification of a wiring arrangement of the composite semiconductor light-emitting device of the third embodiment of the present invention.
Figure 27:
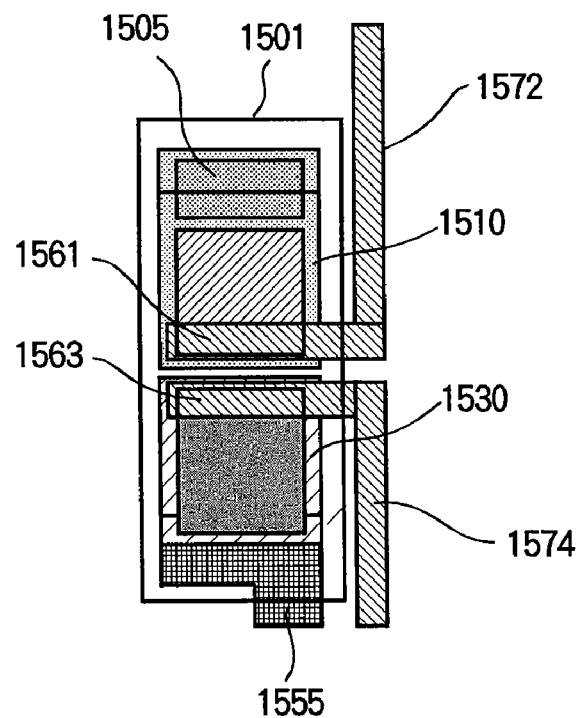
FIG. 27 is a plan view of another modification of the wiring arrangement of the composite semiconductor light-emitting device of the third embodiment of the present invention.
Figure 28:
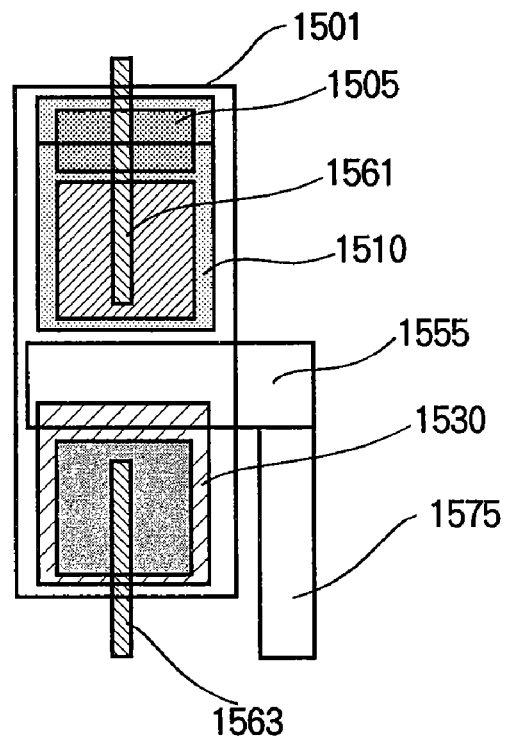
FIG. 28 is a plan view of still another modification of the wiring arrangement of the composite semiconductor light-emitting device of the third embodiment of the present invention.
Figure 29:
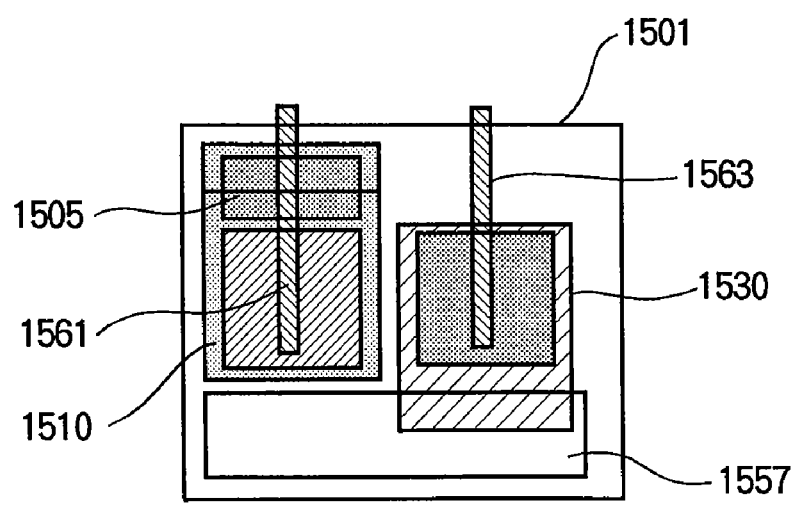
FIG. 29 is a plan view of yet another modification of the wiring arrangement of the composite semiconductor light-emitting device of the third embodiment of the present invention.

FIG. 26 is a plan view showing a modification of the wiring arrangement of the third embodiment. FIG. 27 is a plan view showing another modification of the wiring arrangement of the third embodiment. FIG. 28 is a plan view showing still another modification of the wiring arrangement of the third embodiment. FIG. 29 is a plan view showing yet another modification of the wiring arrangement of the third embodiment. As shown in FIGS. 26 through 29, various modification can be made to the wiring arrangement of the third embodiment in accordance with wiring space.

In an example shown in FIG. 26, the contact layers 1561 and 1563 extend in the same directions, to form extending portions 1571 and 1573. In an example shown in FIG. 27, the contact layers 1561 and 1563 extend in the opposite directions, to form extending portions 1572 and 1574. In an example shown in FIG. 28, the wiring 1555 extends to form an extending portion 1575. In an example shown in FIG. 29, the first and second semiconductor element portions 1510 and 1530 are arranged side by side, and a wiring 1557 is formed to connect the semiconductor element portions 1510 and 1530.

Fourth Embodiment

Figure 30:
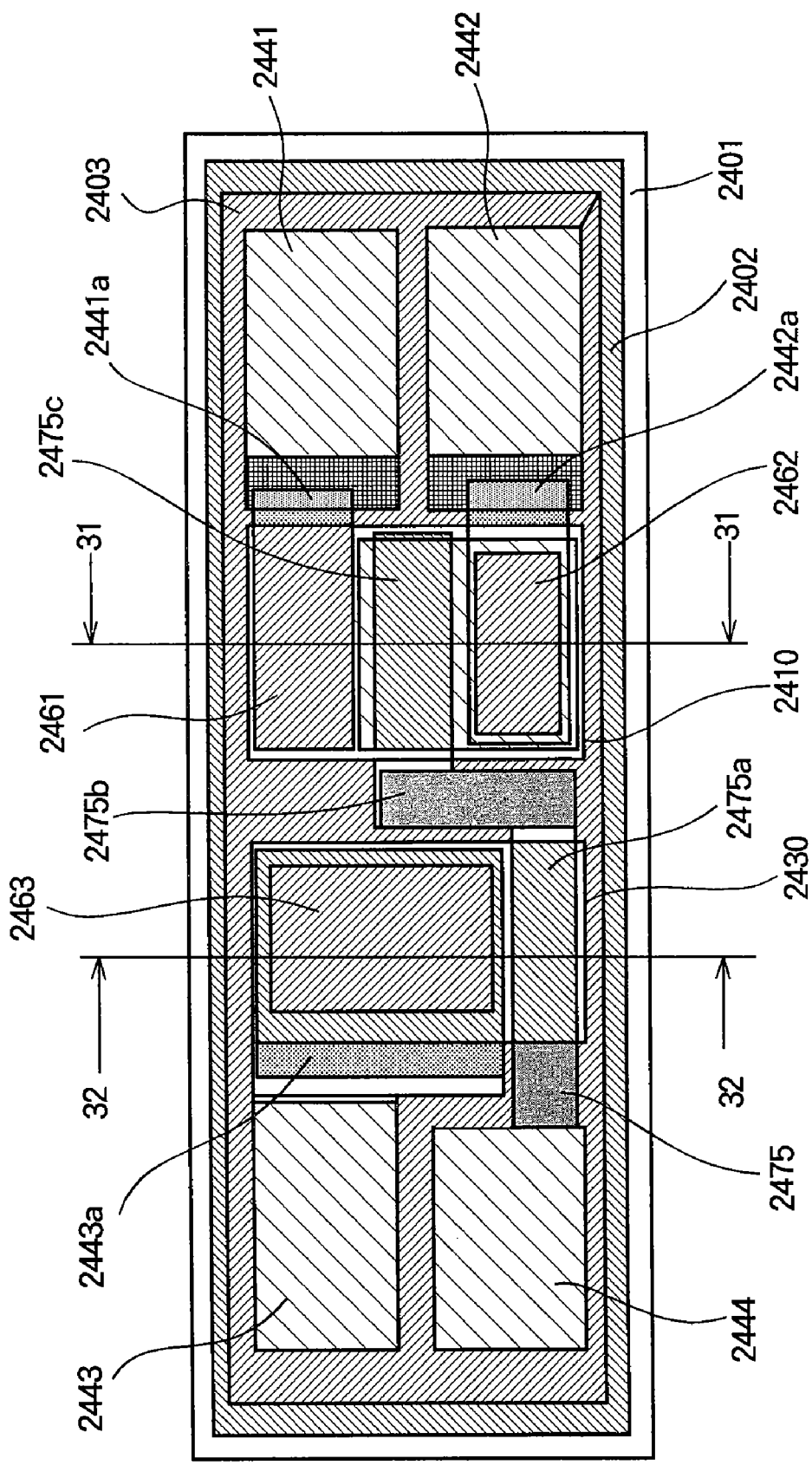
FIG. 30 is a plan view of a composite semiconductor light-emitting device according to the fourth embodiment of the present invention.
Figure 31:
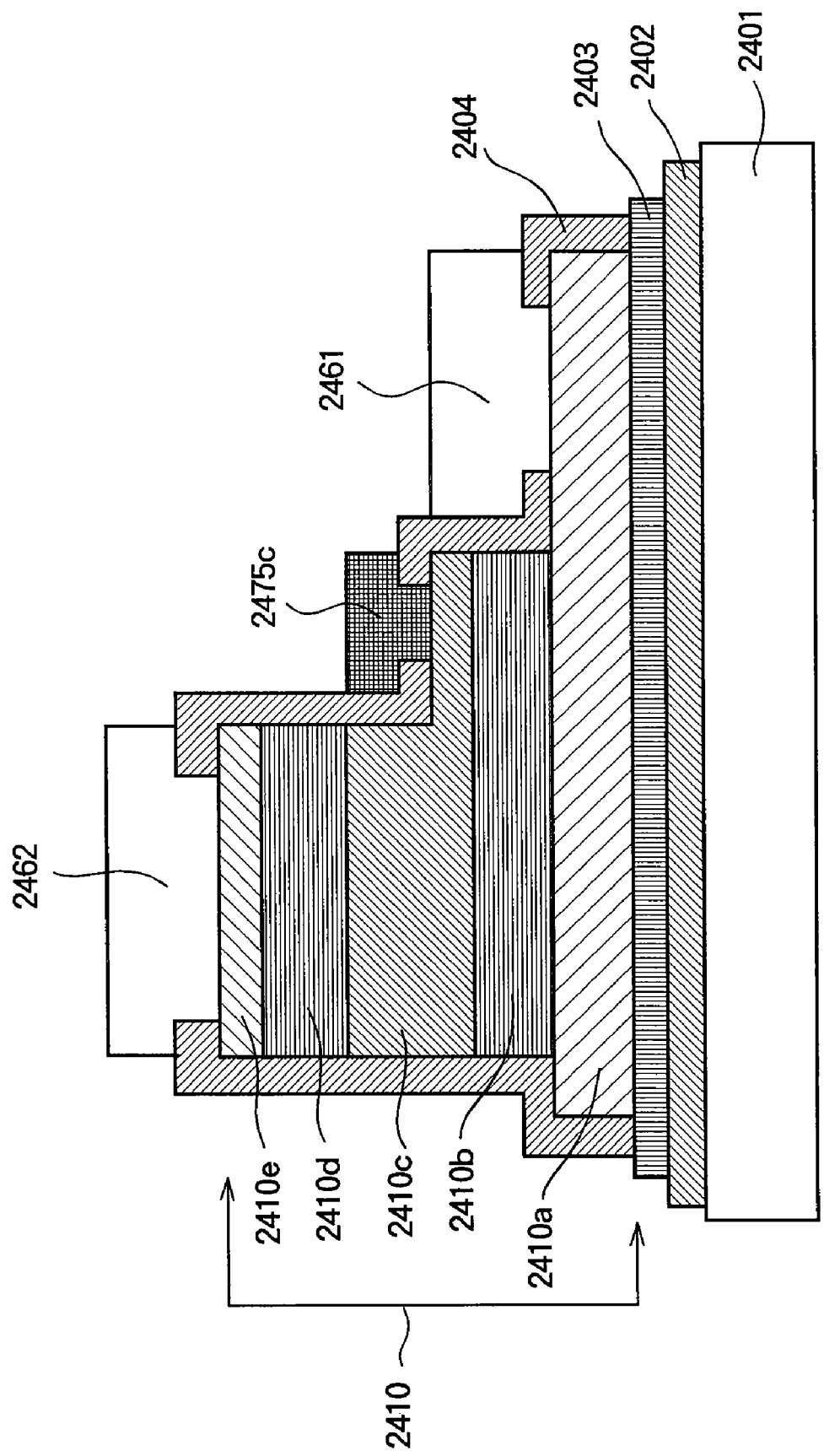
FIG. 31 is a sectional view of the composite semiconductor light-emitting device according to the fourth embodiment of the present invention, taken along line 31-31 in FIG. 30.
Figure 32:
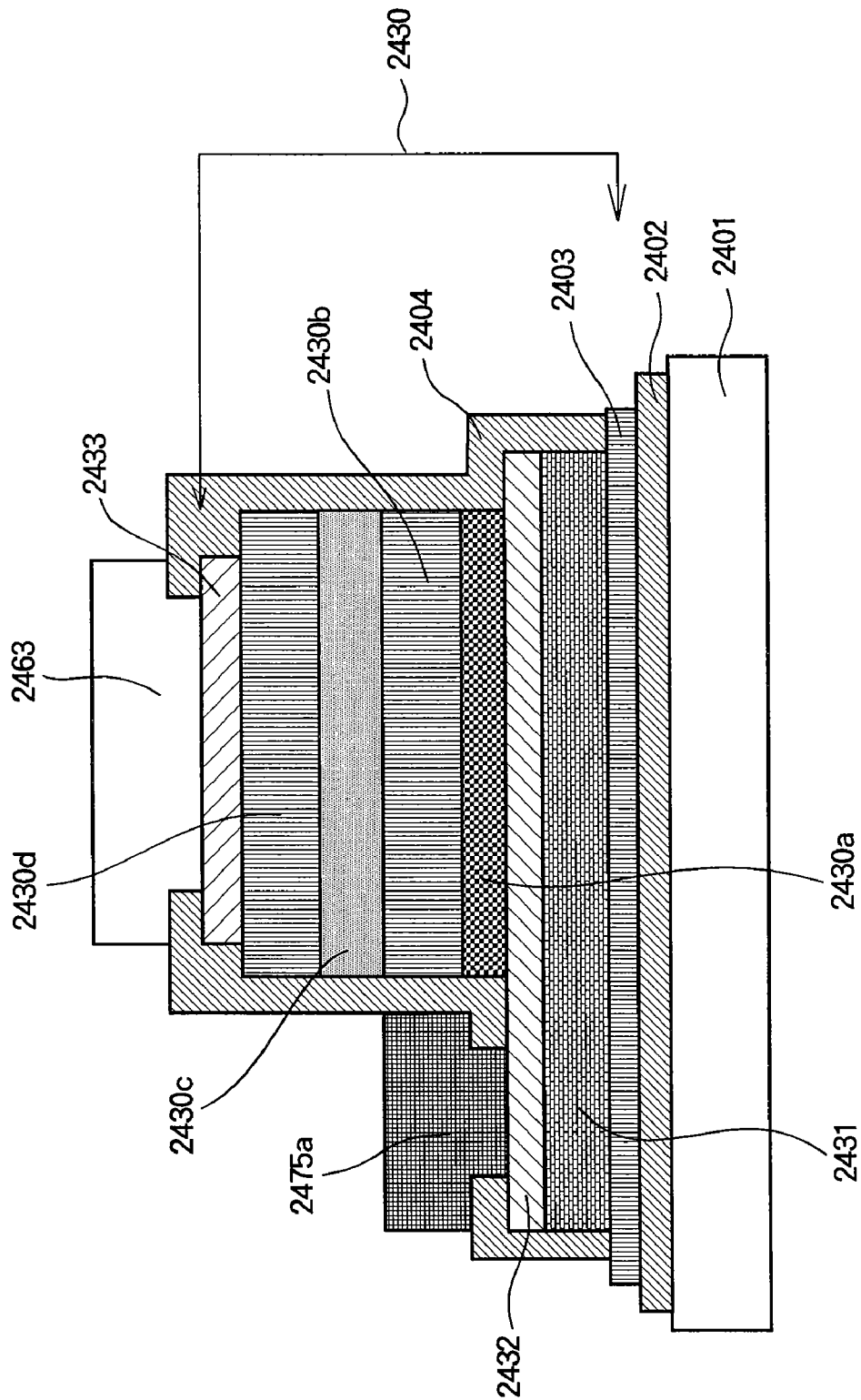
FIG. 32 is a sectional view of the composite semiconductor light-emitting device according to the fourth embodiment of the present invention, taken along line 32-32 in FIG. 30.

FIG. 30 is a plan view schematically showing a composite semiconductor light-emitting device according to the fourth embodiment of the present invention. FIG. 31 is a sectional view taken along line 31-31 shown in FIG. 30. FIG. 32 is a sectional view taken along line 32-32 in FIG. 30. The fourth embodiment is different from the third embodiment in that a first semiconductor element portion 2410 and a second semiconductor element portion 2430 are electrically connected in parallel with each other.

In FIG. 30, the first semiconductor element portion 2410 and the second semiconductor element portion 2430 are disposed adjacent to each other so that the first semiconductor element portion 2410 is disposed on line 31-31 side, and the second semiconductor element portion 2430 is disposed on line 32-32 side.

As shown in FIG. 31, a metal layer 2402 that functions as a reflection film is formed on a substrate 2401, and a first dielectric layer 2403 is formed on the metal layer 2402. The first semiconductor element portion 2410 of a first semiconductor layered structure (having first and second light-emitting regions) and the second semiconductor element portion 2430 of a second semiconductor layered structure (having a third light-emitting region) are formed on the first dielectric layer 2403. The first semiconductor element portion 2410 is made of first semiconductor materials. For example, the first semiconductor element portion 2410 is made of GaN-based nitride semiconductor material such as GaN, $Al_xGa_{1-x}N$ and $Al_xGa_{1-x}N$. The second semiconductor element portion 2430 is made of second semiconductor materials of a group different from the first semiconductor materials. For example, the second semiconductor element portion 2430 is made of GaAs-based semiconductor materials such as $Al_xGa_{1-x-y}P$ and $Al_xGa_{1-x}As$.

The structure of the first semiconductor element portion 2410 will be described. A p-type GaN layer 2410a is formed on the first dielectric layer 2403. A first light-emitting layer 2410b (including a GaInN/GaN multi-quantum well layer and a p-type AlGaN layer) is formed on the p-type GaN layer 2410a. An n-type GaN layer 2410c is formed on the first light-emitting layer 2410b. The layers 2410a, 2410b and 2410c form a first light-emitting region. A second light-emitting region is formed to have an n-side electrode in common with the first light-emitting region. The second light-emitting region includes an n-type GaN layer 2410c, a second light-emitting layer 2410d (including a GaInN/GaN multi-quantum well layer and a p-type AlGaN layer) formed on the n-type GaN layer 2410c, and a p-type GaN layer 2410e formed on the second light-emitting layer 2410d. InN mole fraction of the second light-emitting layer 2410d is smaller than that of the first light-emitting layer 2410b. The above described layers are covered by a dielectric layer 2404. Wirings 2461 and 2462 of the power supply side are respectively connected to p-type GaN layers 2410a and 2410e. A wiring 2475c of the ground side is connected to the n-type GaN layer 2410c.

In FIG. 32, the second semiconductor element portion 2430 is made of GaAs-based semiconductor materials. In particular, an n-type $Al_xGa_{1-x}As$ layer 2430a is formed on the dielectric layer 2403 (via an electrode drawing layer 2431 and a contact metal layer 2432), an n-type GaAs layer 2430b is formed on the n-type $Al_xGa_{1-x}As$ layer 2430a, and a third light-emitting layer 2430c (including an n-type $Al_yGa_{1-y}As$ cladding layer, an n-type $Al_zGa_{1-z}As$ active layer and a p-type $Al_tGa_{1-t}As$ cladding layer) is formed on the n-type GaAs layer 2430b. A p-type GaAs layer 2430d is formed on the third light-emitting layer 2430c. A wiring 2463 of the power-supply voltage side is connected to the p-type GaAs layer 2430d via the contact metal layer 2433. An opening is formed on the dielectric layer 2404 covering the electrode drawing layer 2431. Via the opening of the dielectric layer 2404, the electrode drawing layer 2431 is electrically connected to a wiring 2475a through which the ground potential is applied via a wiring 2475b (FIG. 30).

As shown in FIG. 30, the wiring 2475 is a common wiring for the first semiconductor element portion 2410 and the second semiconductor element portion 2430. A ground potential is applied to the wiring 2475 via a common electrode pad 2444. Power-supply voltages are applied via the other three electrode pads 2443, 2441 and 2442 to the wirings 2463, 2461 and 2462. The first light-emitting region of the first semiconductor element portion 2410 operates by applying the voltage between the electrode 2461 and the electrode 2475c. The second light-emitting region of the first semiconductor element portion 2410 is operated by applying the voltage between the electrode 2475c and the electrode 2462. The third light-emitting region of the second semiconductor element portion 2430 is operated by applying the voltage between the electrode 2475a and the electrode 2463. The examples and modifications of the respective semiconductor element portions described in the first embodiment can be applied to the fourth embodiment. Further, the modifications of the materials or the like described in the first embodiment can be applied to the fourth embodiment.

According to the fourth embodiment of the present invention, the light-emitting regions of the first semiconductor element portion 2410 and the light-emitting region of the second semiconductor element portion 2430 are connected in parallel with each other, and therefore the degrees of freedom in controlling of the respective light-emitting regions increase. Further, the voltages for operating the respective light-emitting regions can be reduced by connecting the light-emitting regions in parallel with each other.

FIGS. 33 through 38 show the modifications of the connection between the light-emitting regions of the first semiconductor element portion 2410 and the light-emitting region of the second semiconductor element portion 2430. In each modification, the light-emitting regions of the first semiconductor element portion 2410 and the light-emitting region of the second semiconductor element portion 2430 are connected in parallel with each other. In each of the modifications shown in FIGS. 33 through 38, it is possible to reverse the power-supply side and the ground side with respect to each other, and to reverse p-side and n-side (not shown) of the device with respect to each other.

Figure 33:
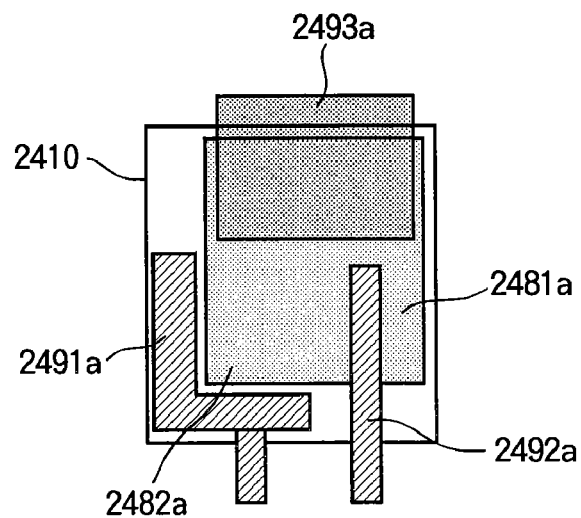
FIG. 33 is a plan view of a modification of a wiring arrangement of light-emitting regions included in the respective semiconductor element portions of the composite semiconductor light-emitting device of the fourth embodiment of the present invention.

FIG. 33 shows an example in which first and second light-emitting regions 2482a and 2481a of the first semiconductor element portion 2410 and a light-emitting region (not shown) of the second semiconductor element portion (not shown) are connected in parallel with each other. Power-supply wirings 2491a and 2492a and a ground wiring 2493a are connected to the light-emitting regions 2482a and 2481a. The power-supply wiring 2491a is formed on the periphery of the first light-emitting region 2482a of the first semiconductor element portion 2410 so that the power-supply wiring 2491a does not cover the first light-emitting region 2482a.

Figure 34:
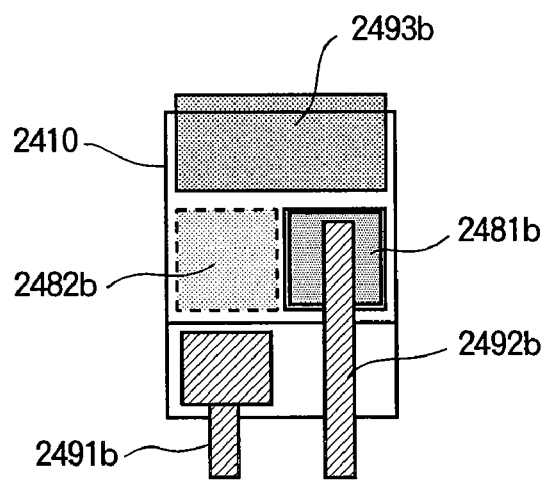
FIG. 34 is a plan view of another modification of the wiring arrangement of the light-emitting regions included in the respective semiconductor element portions of the composite semiconductor light-emitting device of the fourth embodiment of the present invention.

FIG. 34 shows another example in which first and second light-emitting regions 2482b and 2481b of the first semiconductor element portion 2410 and a light-emitting region (not shown) of the second semiconductor element portion (not shown) are connected in parallel with each other. Power-supply wirings 2491b and 2492b and a ground wiring 2493b are connected to the light-emitting regions 2482b and 2481b. The power-supply wiring 2491b is disposed on a position shifted from the first light-emitting region 2482b of the first semiconductor element portion 2410. The power-supply wiring 2492b is disposed directly on the second light-emitting region 2481b of the first semiconductor element portion 2410.

Figure 35:
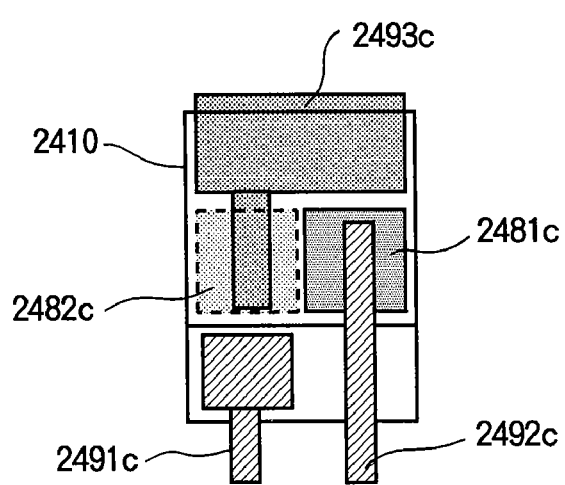
FIG. 35 is a plan view of still another modification of the wiring arrangement of the light-emitting regions included in the respective semiconductor element portions of the composite semiconductor light-emitting device of the fourth embodiment of the present invention.

FIG. 35 shows still another example in which first and second light-emitting regions 2482c and 2481c of the first semiconductor element portion 2410 and a light-emitting region (not shown) of the second semiconductor element portion (not shown) are connected in parallel with each other. Power-supply wirings 2491c and 2492c and a ground wiring 2493c are connected to the light-emitting regions 2482c and 2481c. The power-supply wiring 2491c is disposed on a position shifted from the first light-emitting region 2482c of the first semiconductor element portion 2410. The ground wiring 2493c extends to a position above the first light-emitting region 2482c of the first semiconductor element portion 2410.

Figure 36:
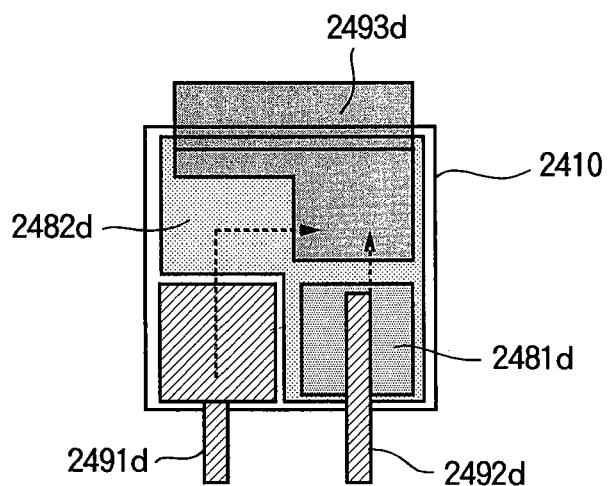
FIG. 36 is a plan view of yet another modification of the wiring arrangement of the light-emitting regions included in the respective semiconductor element portions of the composite semiconductor light-emitting device of the fourth embodiment of the present invention.

FIG. 36 shows yet another example in which first and second light-emitting regions 2482d and 2481d of the first semiconductor element portion 2410 and a light-emitting region (not shown) of the second semiconductor element portion (not shown) are connected in parallel with each other. The light-emitting regions 2482d and 2481d are not disposed adjacent to each other, but obliquely face each other. Power-supply wirings 2491d and 2492d and a ground wiring 2493d are connected to the light-emitting regions 2482d and 2481d. The power-supply wiring 2491d is disposed adjacent to the first light-emitting region 2482d, and is disposed on a position shifted from the first light-emitting region 2482d to the second light-emitting region 2481d side in such a manner that the power-supply wiring 2491d occupies a small space.

Figure 37:
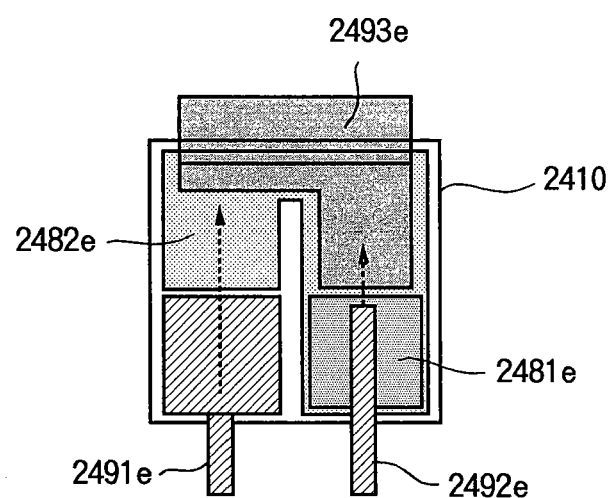
FIG. 37 is a plan view of a further modification of the wiring arrangement of the light-emitting regions included in the respective semiconductor element portions of the composite semiconductor light-emitting device of the fourth embodiment of the present invention.

FIG. 37 shows further example in which first and second light-emitting regions 2482e and 2481e of the first semiconductor element portion 2410 and a light-emitting region (not shown) of the second semiconductor element portion (not shown) are connected in parallel with each other. The light-emitting regions 2482e and 2481e are not disposed adjacent to each other, but obliquely face each other. Power-supply wirings 2491e and 2492e and a ground wiring 2493e are connected to the light-emitting regions 2482e and 2481e. The power-supply wiring 2491e is disposed adjacent to the first light-emitting region 2482e, and is disposed on a position shifted from the first light-emitting region 2482e to the second light-emitting region 2481e side in such a manner that the power-supply wiring 2491e occupies a small space. A cutout portion is formed on the center portion of the first light-emitting region 2482e. With such an arrangement, the length of the pass of current can be increased, and therefore it becomes possible to prevent the concentration of the current on the contact portion.

Figure 38:
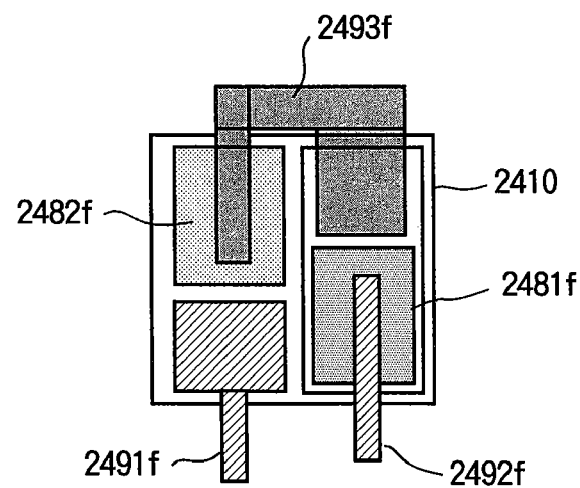
FIG. 38 is a plan view of still further modification of the wiring arrangement of the light-emitting regions included in the respective semiconductor element portions of the composite semiconductor light-emitting device of the fourth embodiment of the present invention.

FIG. 38 shows still further example in which first and second light-emitting regions 2482f and 2481f of the first semiconductor element portion 2410 and a light-emitting region (not shown) of the second semiconductor element portion (not shown) are connected in parallel with each other. The light-emitting regions 2482f and 2481f are not disposed adjacent to each other, but obliquely face each other. Power-supply wirings 2491f and 2492f and a ground wiring 2493f are connected to the light-emitting regions 2482f and 2481f. The power-supply wiring 2491f is disposed adjacent to the first light-emitting region 2482f, and is disposed on a position shifted from the first light-emitting region 2482f to the second light-emitting region 2481f side in such a manner that the power-supply wiring 2491f occupies a small space. The ground region 2493f extends outside the first light-emitting region 2482f.

Fifth Embodiment

Figure 39:
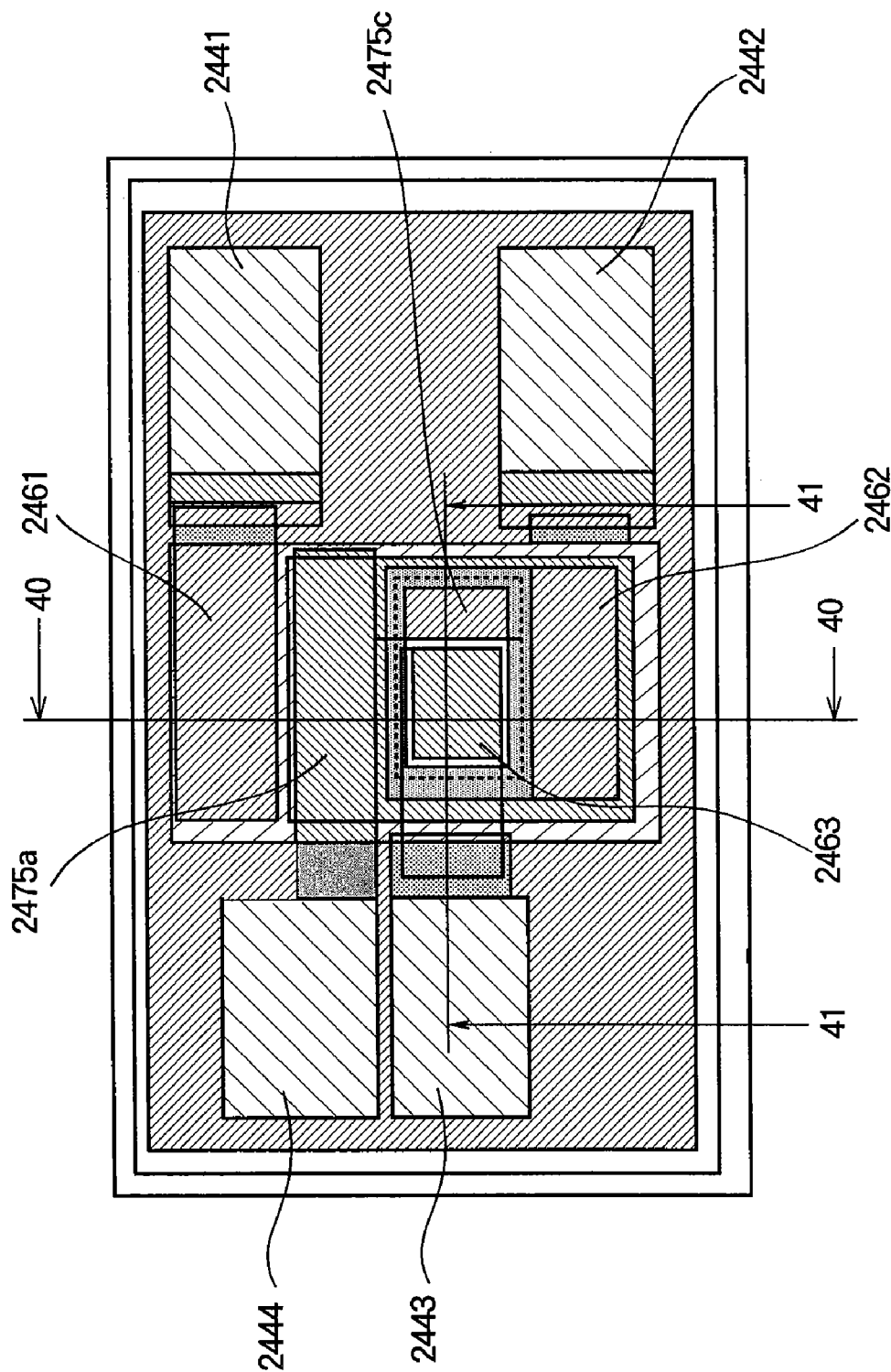
FIG. 39 is a plan view of a composite semiconductor light-emitting device according to the fifth embodiment of the present invention.
Figure 40:
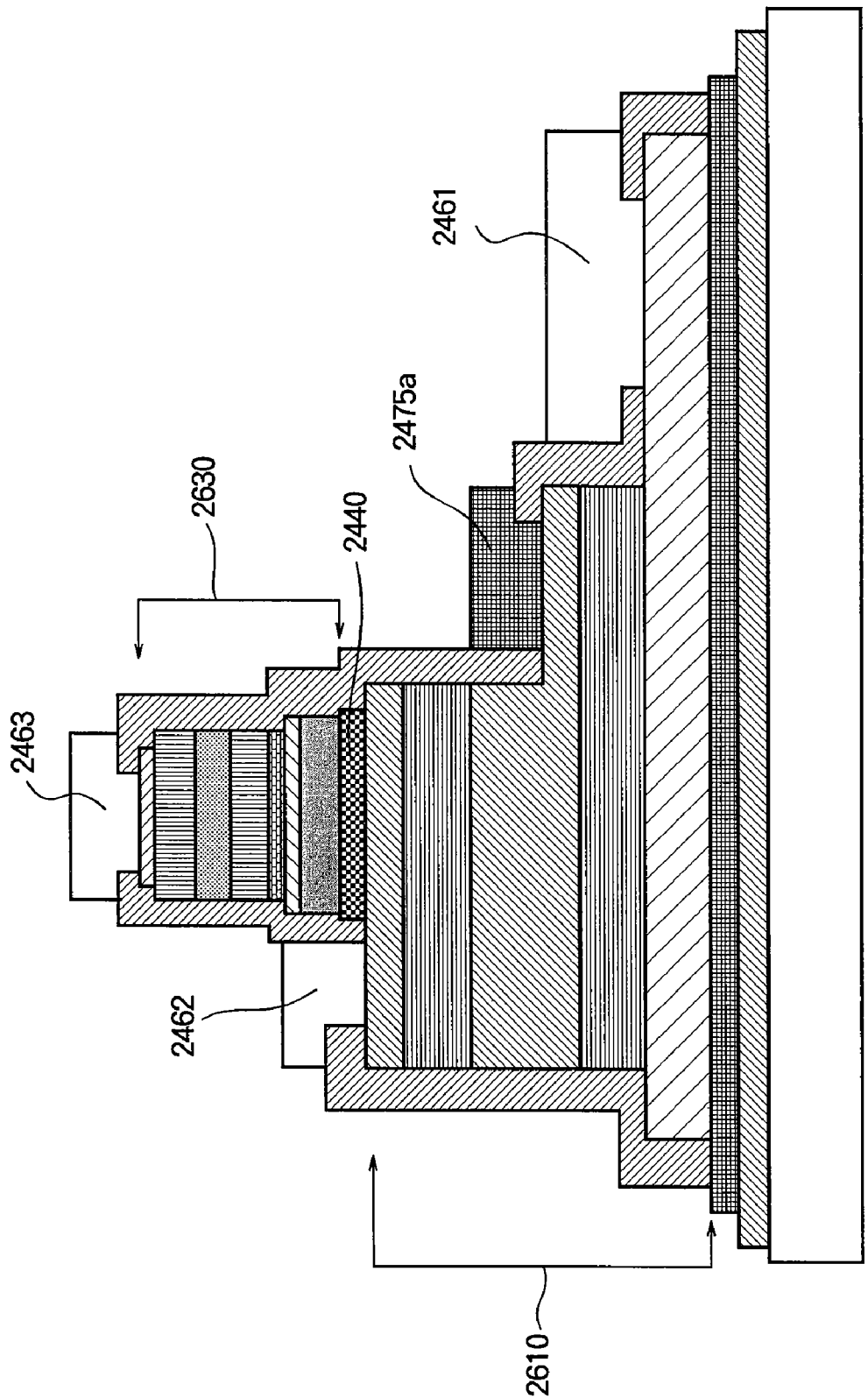
FIG. 40 is a sectional view of the composite semiconductor light-emitting device according to the fifth embodiment of the present invention, taken along line 40-40 in FIG. 39.
Figure 41:
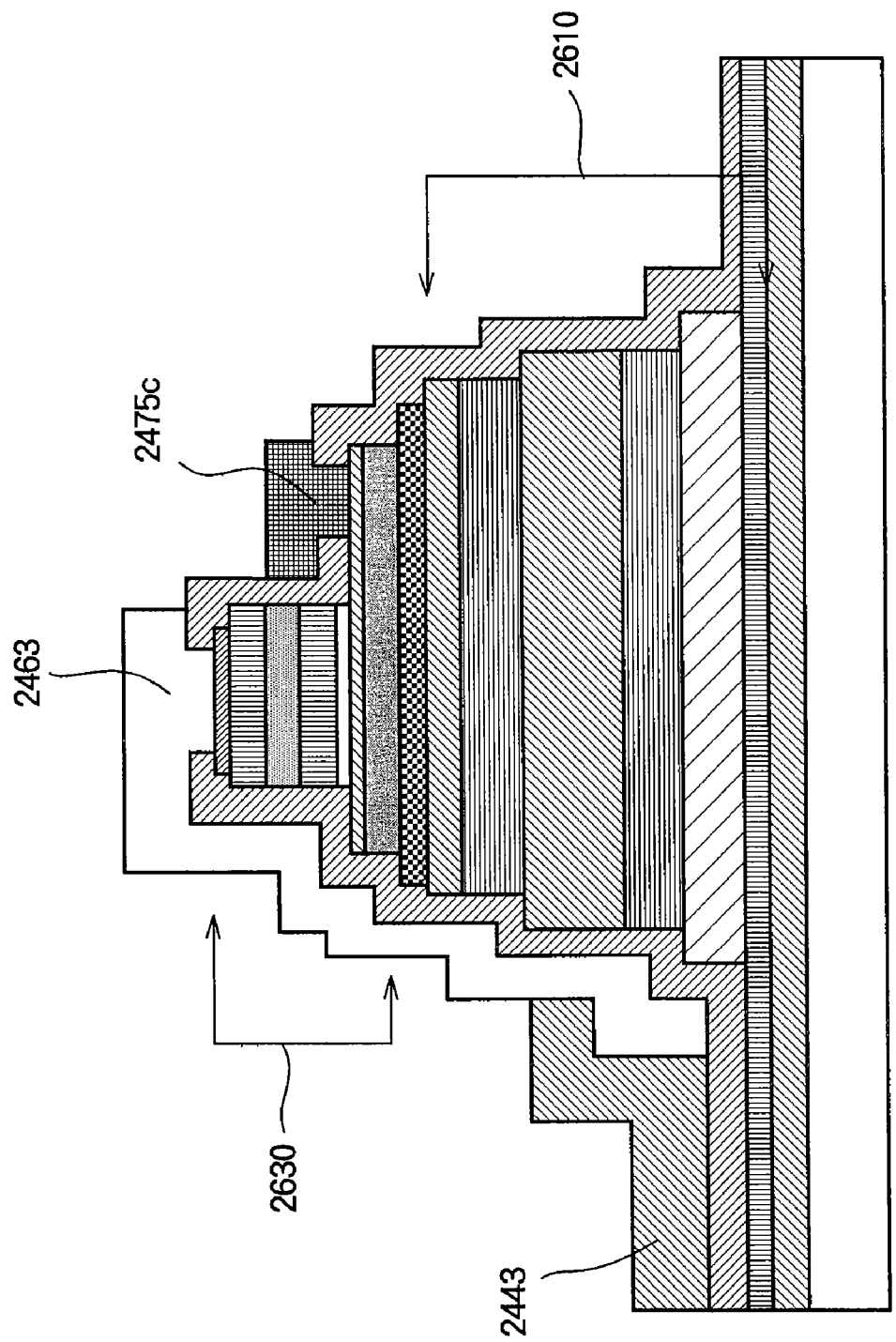
FIG. 41 is a sectional view of the composite semiconductor light-emitting device according to the fifth embodiment of the present invention, taken along line 41-41 in FIG. 39.

FIG. 39 is a plan view schematically showing a composite semiconductor light-emitting device according to the fifth embodiment of the present invention. FIG. 40 is a sectional view taken along line 40-40 in FIG. 39. FIG. 41 is a sectional view taken along line 41-41 in FIG. 39. The fifth embodiment is different from the fourth embodiment in that a second semiconductor element portion 2630 made of GaAs-based semiconductor layers is bonded onto a first semiconductor element portion 2610 made of GaN-based semiconductor layers. The respective semiconductor element portions 2610 and 2630 can have the structures as descried in the first embodiment. Further, in the fifth embodiment, the respective light-emitting regions are electrically connected in parallel with each other. Modifications of the fourth embodiment are applicable to the fifth embodiment. As shown in FIG. 40, the second semiconductor element portion 2630 is bonded onto a second dielectric layer 2440 on the first semiconductor element portion 2610.

According to the fifth embodiment, the second semiconductor element portion 2630 is bonded onto the first semiconductor element portion 2610, and therefore it is possible to obtain an advantage that the semiconductor element portions can be integrated in a small region, in addition to the advantages of the fourth embodiment. Therefore, the processing speed of the semiconductor element portions can be enhanced, and the yield of the manufacturing process can be enhanced.

Sixth Embodiment

Figure 42:
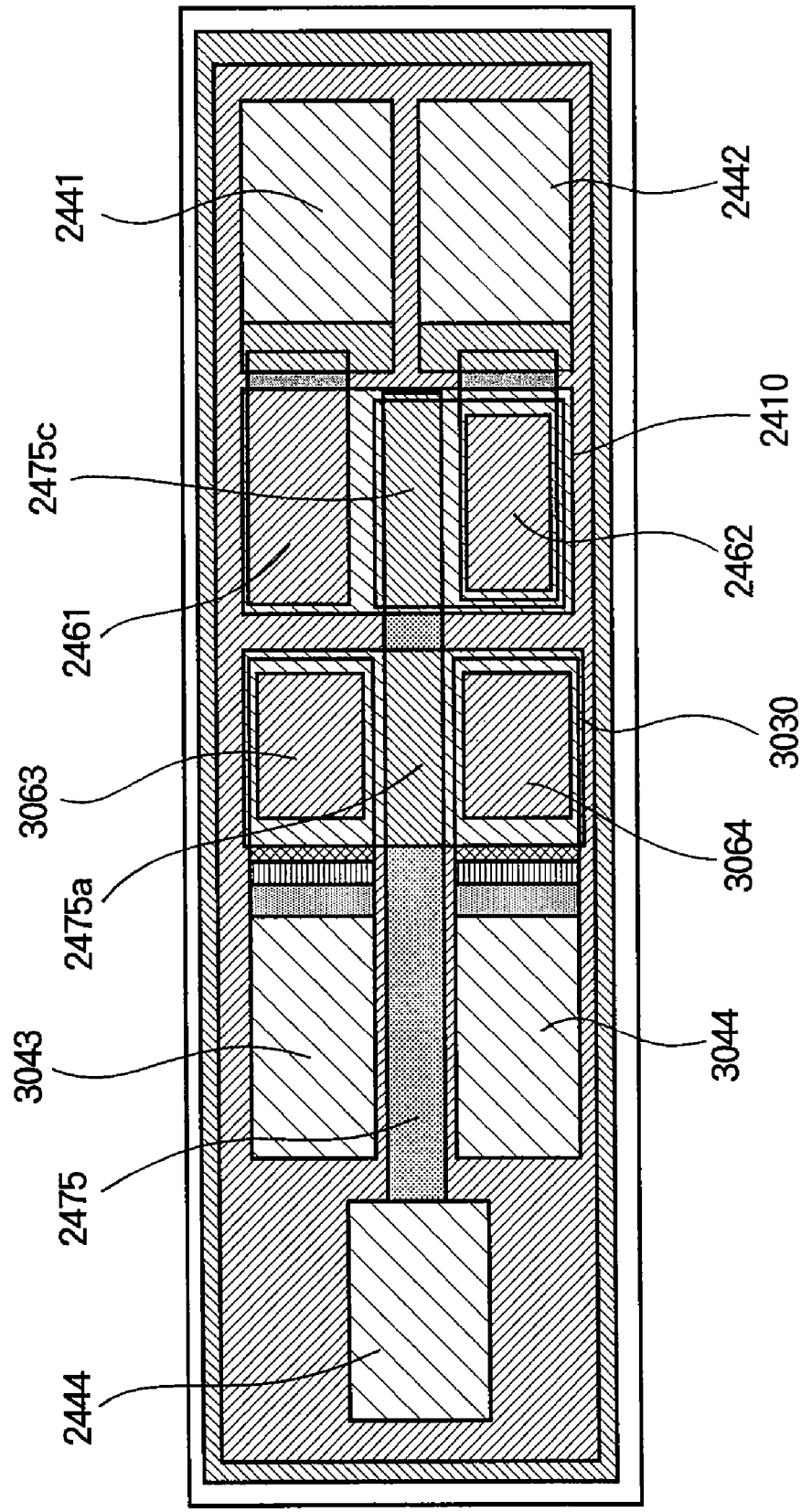
FIG. 42 is a schematic plan view of a composite semiconductor light-emitting device according to the sixth embodiment of the present invention.

FIG. 42 is a plan view schematically showing a composite semiconductor light-emitting device of the sixth embodiment of the present invention. The sixth embodiment is different from the fourth embodiment in that a second semiconductor element portion 3030 includes two light-emitting regions 3063 and 3064 having the same structures. If the light-emission efficiency of the light-emitting region of the second semiconductor element portion 3030 is lower than the light-emitting regions of the first semiconductor element portion 2410, it is possible to provide a plurality of light-emitting regions 3063 and 3064 on the second semiconductor element portion 3030, and to individually control the light-emitting regions to emit lights. With such an arrangement, it becomes easy to control the balance of the total amount of the lights emitted by the light-emitting regions of the first semiconductor element portion 2410 and the total amount of the lights emitted by the light-emitting regions of the second semiconductor element portion 3030. Regarding the semiconductor structures of respective semiconductor element portions, it is possible to employ the semiconductor element portions as described in the first embodiment.

Figure 43:
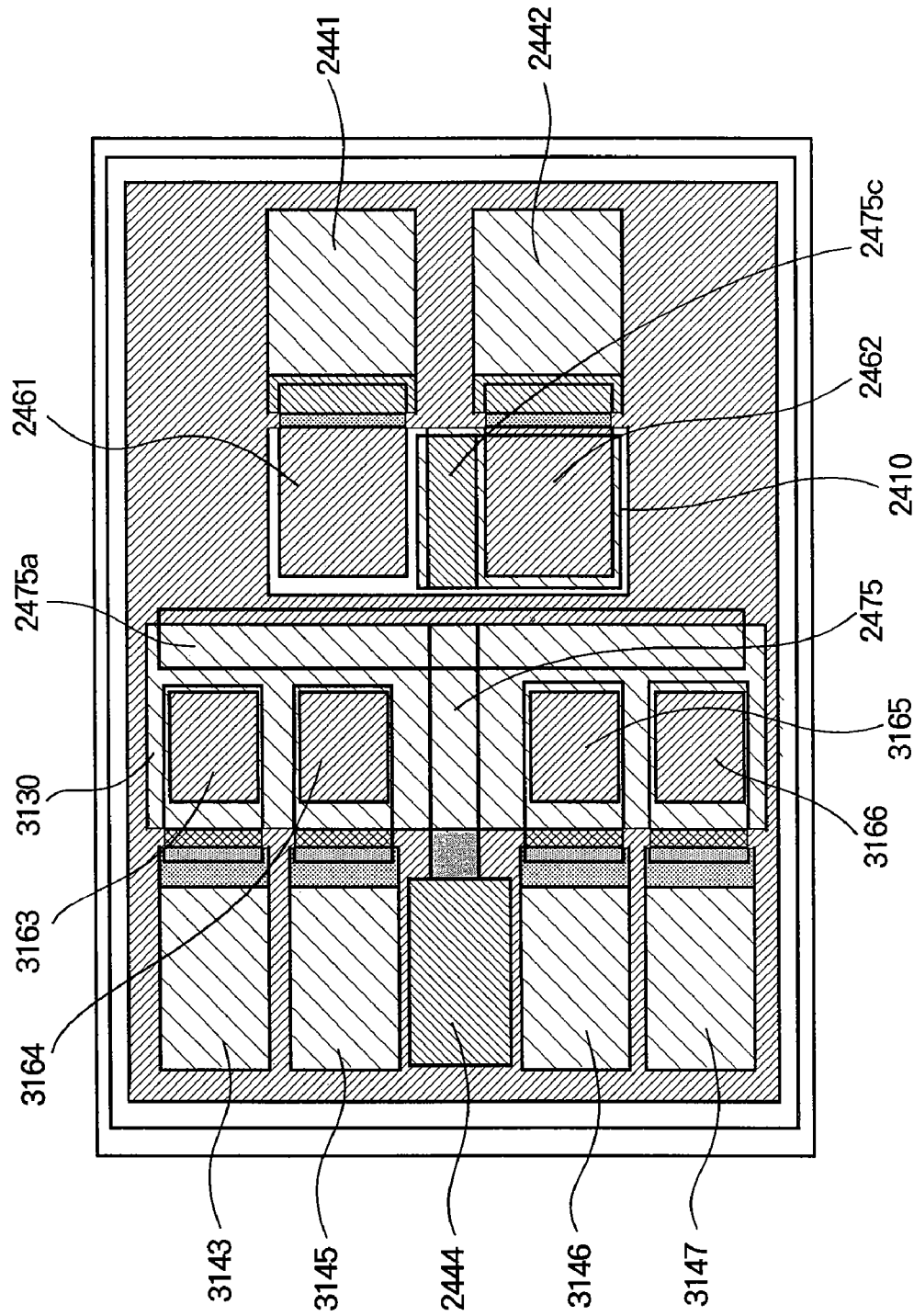
FIG. 43 is a schematic plan view of a modification of the composite semiconductor light-emitting device according to the sixth embodiment of the present invention.

In FIG. 42, the number of the light-emitting regions of the second semiconductor element portion 3030 is two, but can be appropriately varied as shown in FIG. 43. In an example shown in FIG. 43, four light-emitting regions 3163 through 3166 are formed on the second semiconductor element portion 3130. The four light-emitting regions 3163 through 3166 are supplied with currents respectively via electrode pads 3143, 3145, 3146 and 3147.

According to the sixth embodiment of the present invention, the second semiconductor element portion 3030 has a plurality of light-emitting regions (with respect to the first semiconductor element portion 2410 having the light-emitting regions), it becomes easy to control the balance of the total amount of the lights emitted by the light-emitting regions of the first semiconductor element portion 2410 and the total amount of the lights emitted by the light-emitting regions of the second semiconductor element portion 3030.

Seventh Embodiment

Figure 44:
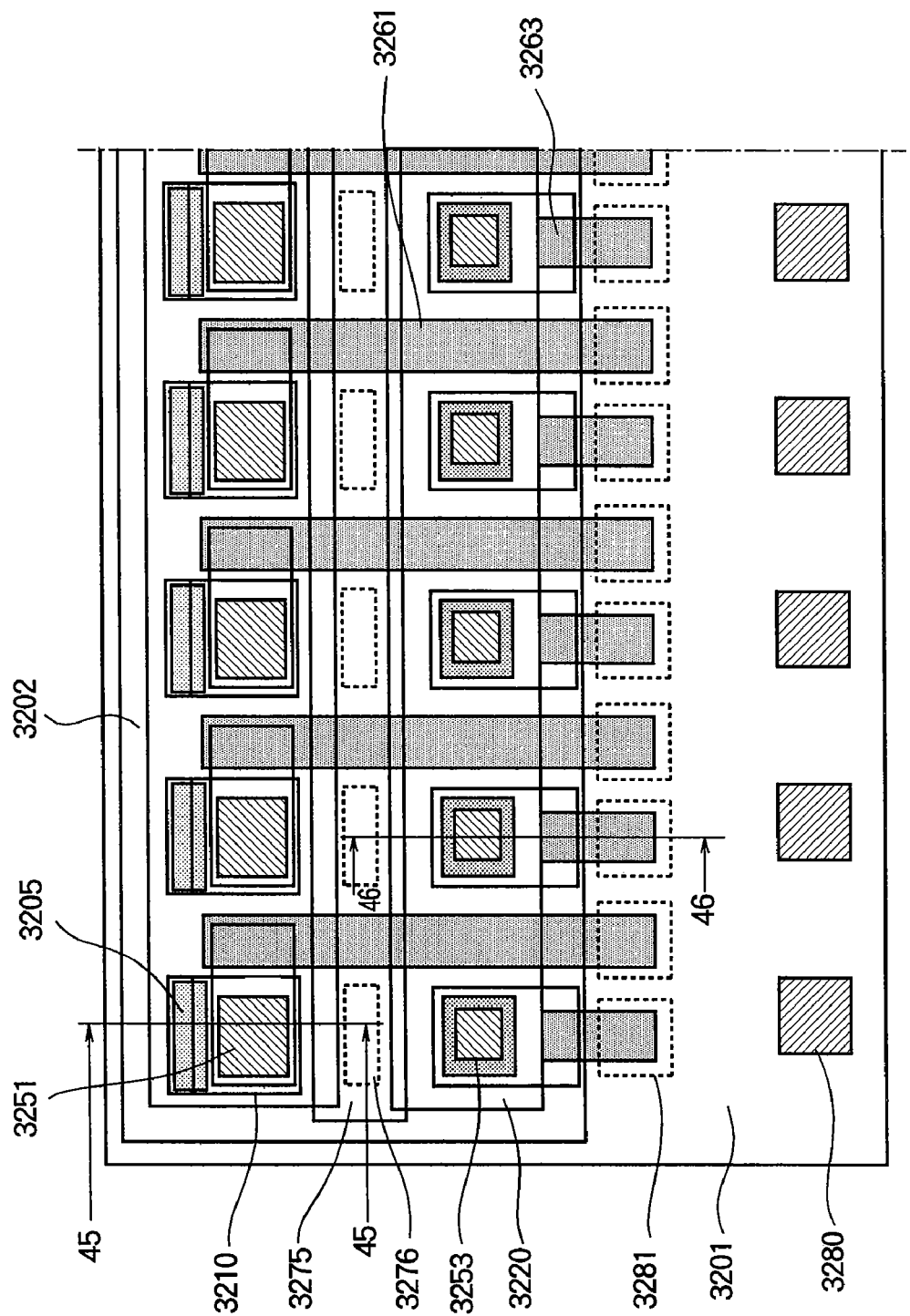
FIG. 44 is a plan view of a composite semiconductor light-emitting device according to the seventh embodiment of the present invention.
Figure 45:
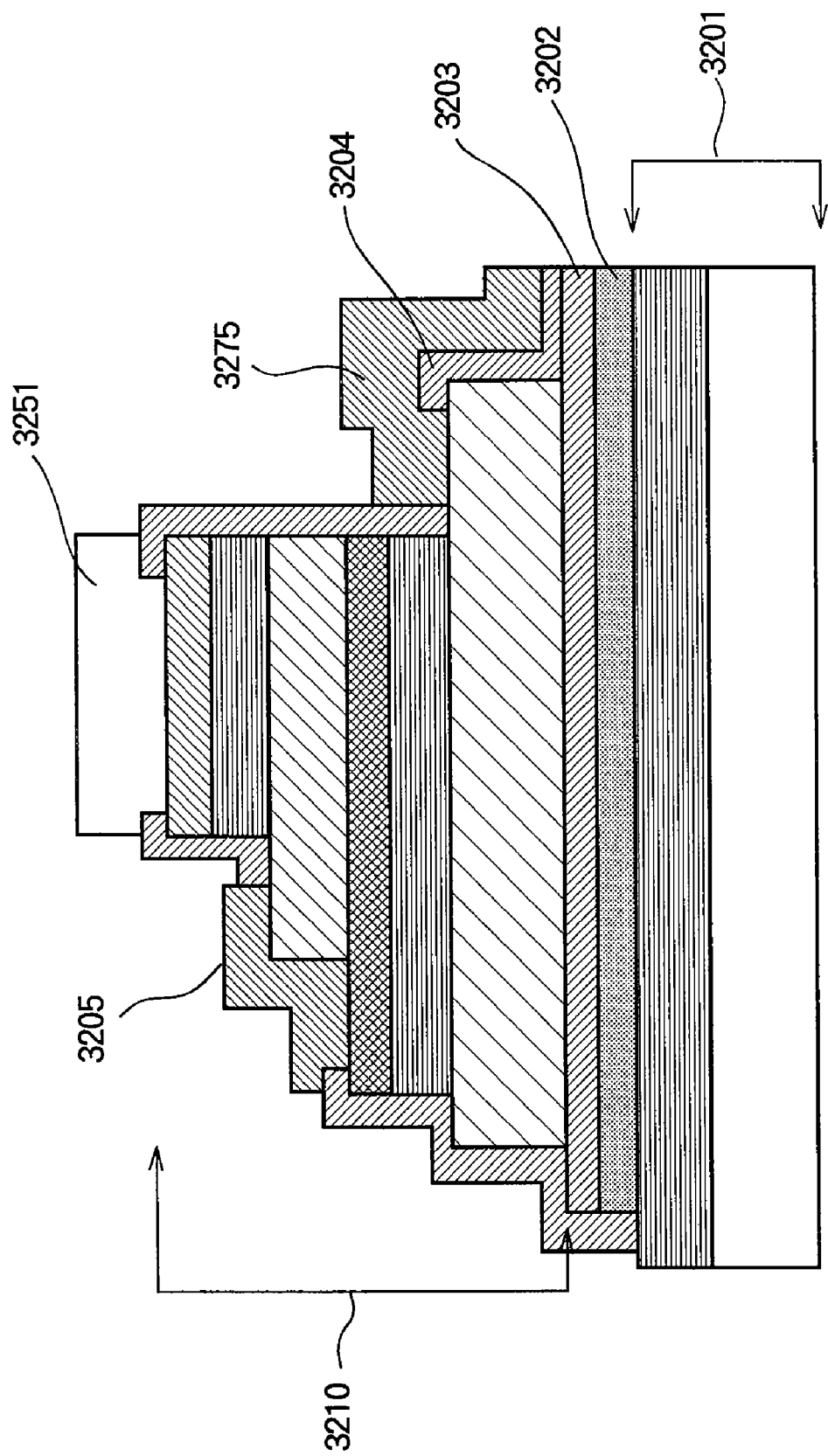
FIG. 45 is a sectional view of the composite semiconductor light-emitting device according to the seventh embodiment of the present invention, taken along line 45-45 in FIG. 44.
Figure 46:
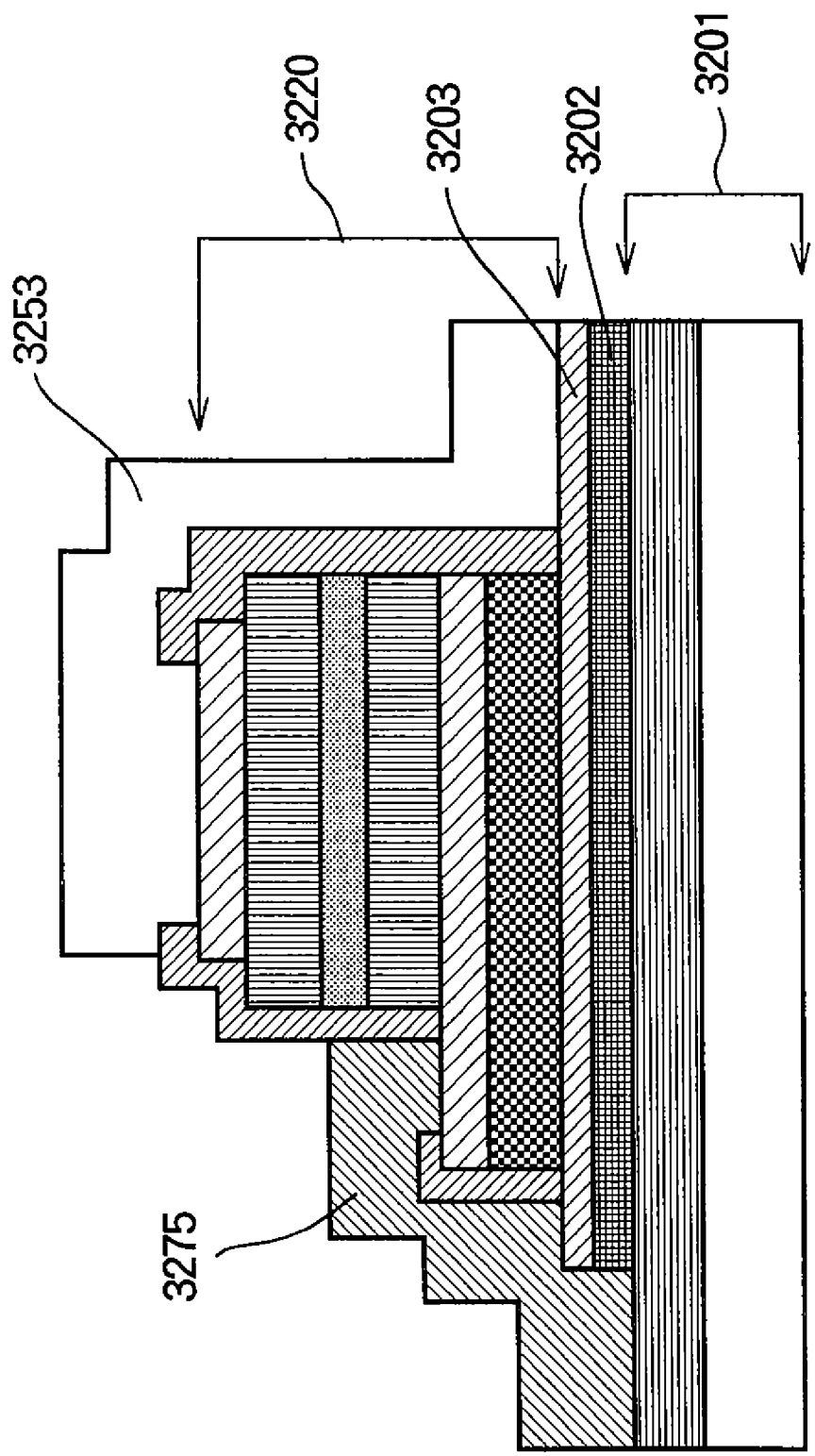
FIG. 46 is a sectional view of the composite semiconductor light-emitting device according to the seventh embodiment of the present invention, taken along line 46-46 in FIG. 45.

FIG. 44 is a plan view schematically showing a composite semiconductor light-emitting device of the seventh embodiment of the present invention. FIG. 45 is a sectional view taken along line 45-45 in FIG. 44. FIG. 46 is a sectional view taken along line 46-46 in FIG. 45.

As shown in FIGS. 44 through 46, the composite semiconductor light-emitting device of the seventh embodiment includes a substrate 3201 (of a driving integrated circuit board) on which a driving integrated circuit for driving the light-emitting elements is formed. On the substrate 3201, a metal layer 3202 (having a function to reflect the light emitted by the light-emitting element and an electrical wiring function), a dielectric layer 3203 (for bonding a semiconductor film having a semiconductor element portion), first semiconductor element portions 3210 having light-emitting regions, second semiconductor element portions 3220 having light-emitting regions, a common electrode 3275 (for the light-emitting regions of the first and second semiconductor element portions 3210 and 3220), contact regions 3276 that electrically connect the common electrode 3275 and the metal layer 3202, wirings 3205 each of which connects two light-emitting regions of each first semiconductor element portion 3210, wirings 3261 led from the first semiconductor element portions 3210, wirings 3263 led from the second semiconductor element portions 3220, input pads 3280 for inputs to the driving integrated circuit, and connection pads 3281 that connect the wirings 3261 and 3263 are formed.

The metal layer 3202 having a function as a common wiring is connected to a ground potential (not shown) provided in the driving integrated circuit or a ground-input pad (not shown) connectable directly from outside ground potential. Electrode contacts 3251 and 3253 are formed on the light-emitting elements of the first and second semiconductor element portions 3210 and 3220. The electrode contacts 3251 and 3253 can be formed as transparent electrodes made of ITO (Indium Tin Oxide) or ZnO (Zinc Oxide). The electrode contacts 3251 and 3253 can be made of metal and formed to partially cover the light-emitting regions.

As shown in FIGS. 44 through 46, each of the semiconductor element portions 3210 and 3220 has a plurality of light-emitting regions. The respective light-emitting regions of the second semiconductor element portion 3220 are configured and wired so that the light-emitting regions of the second semiconductor element portion 3220 can be controlled to emit lights individually and separately from the light-emitting regions of the first semiconductor element portion 3210. The respective light-emitting regions can be arranged at constant pitches, or can be arranged at different pitches. The respective semiconductor element portions 3210 and 3220 can have the structures as described in the first embodiment, and can be modified as described in the first embodiment.

According to the seventh embodiment, each of the first and second semiconductor element portions 3210 and 3220 have a plurality of light-emitting regions that can be individually controlled to emit lights, and therefore it becomes possible to finely adjust the color and the emission property, and to integrate the light-emitting regions at high density.

Eight Embodiment

Figure 47:
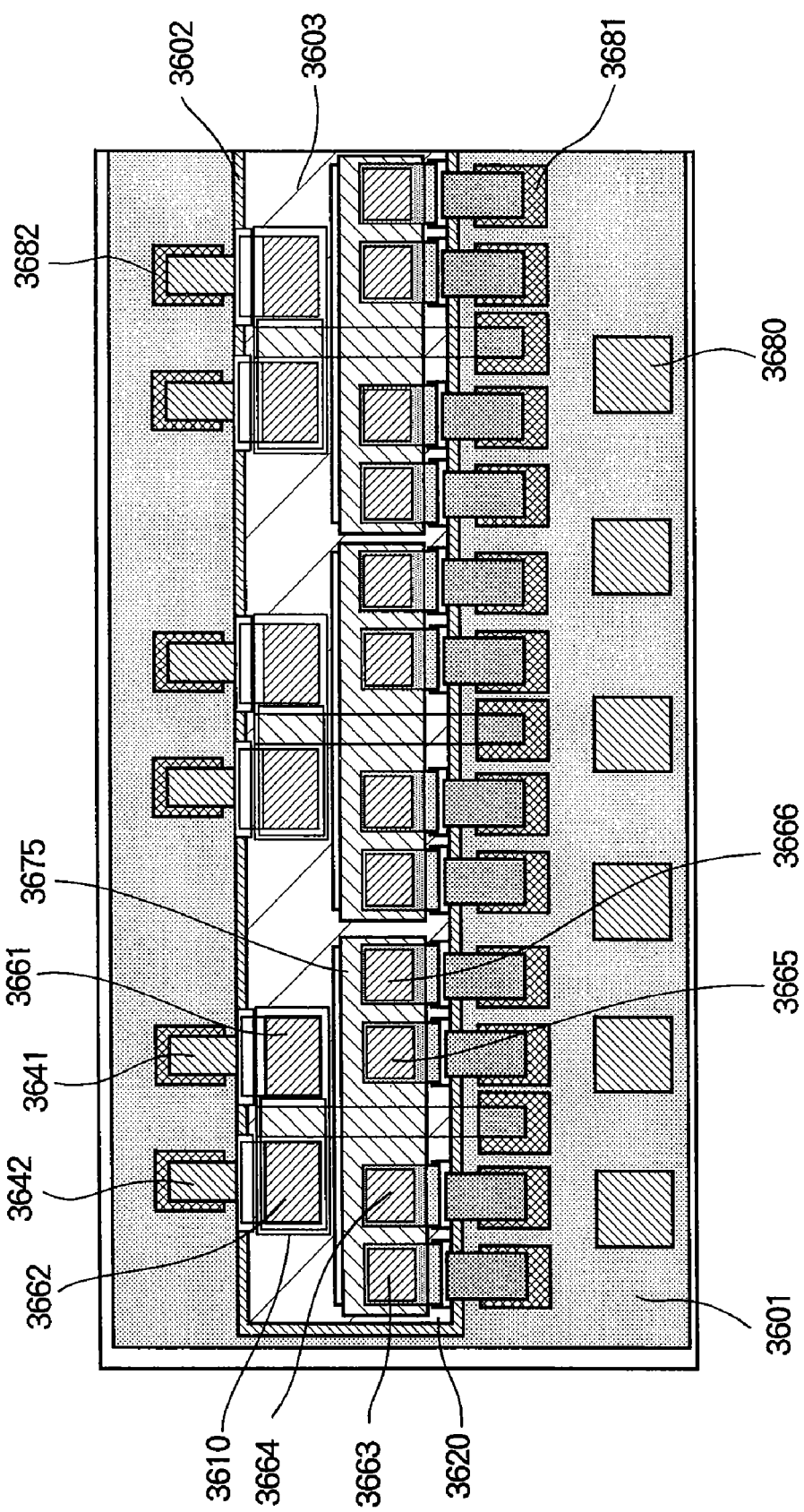
FIG. 47 is a schematic plan view of a composite semiconductor light-emitting device according to the eighth embodiment of the present invention.

FIG. 47 is a plan view of a composite semiconductor light-emitting device according to the eight embodiment of the present invention. Different from the seventh embodiment, in the eight embodiment, a plurality of light-emitting regions of each semiconductor element portion are connected in parallel with each other.

In the eight embodiment shown in FIG. 47, first semiconductor element portions 3610 and second semiconductor element portions 3620 are bonded onto a integrated circuit for driving light-emitting elements as described in the seventh embodiment. In FIG. 47, on a substrate 3601 of an integrated circuit board (on which integrated circuits are formed), input pads 3680, connection pads 3681 and 3682 that electrically connect wirings (connected to the light-emitting elements) and the integrated circuit, wirings 3642 and 3641 that electrically connect the connection pads and the electrodes, individual electrodes 3661 and 3662 (made of transparent electrodes) for the light-emitting regions of the first semiconductor element portions 3610, and individual electrodes 3663, 3664, 3665 and 3666 (made of transparent electrodes) for the light-emitting regions of the second semiconductor element portions 3620 are formed. A common wiring 3675 is electrically connected to a ground potential. A metal layer 3602 is formed on the substrate 3601, and the metal layer 3602 reflects the light emitted by the respective light-emitting regions.

According to the eight embodiment of the present invention, all light-emitting elements provided below the individual electrodes 3661 through 3664 are connected in parallel with each other. Therefore, it becomes easy to individually control the integrated light-emitting regions, and to finely control the balance of the lights emitted from the light-emitting regions. Although the first and second semiconductor element portions 3610 and 3620 are bonded onto the different regions on the substrate 3601 in FIG. 47, it is also possible that the second semiconductor element portions 3620 are bonded onto the first semiconductor element portions 3610. Although the second semiconductor element portion includes four light-emitting regions in FIG. 47, the number of the light-emitting regions is not limited to four but can be appropriately varied. Further, the arrangement pitch and configuration can be appropriately modified.

Ninth Embodiment

Figure 48:
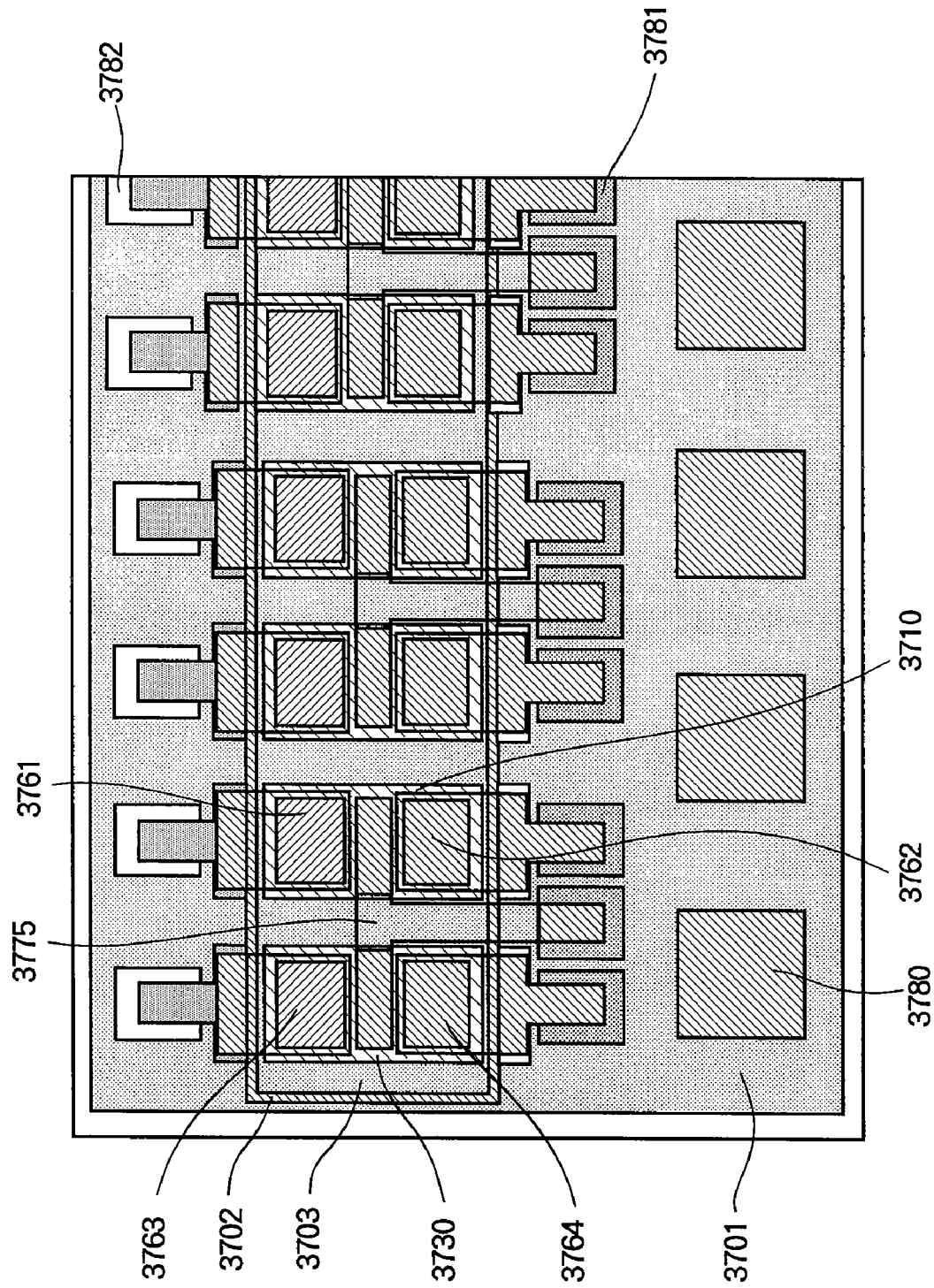
FIG. 48 is a schematic plan view of a composite semiconductor light-emitting device according to the ninth embodiment of the present invention.

FIG. 48 is a plan view schematically showing a composite semiconductor light-emitting device according to the ninth embodiment of the present invention. The ninth embodiment is different from the seventh and eight embodiments in that a first semiconductor element portion 3710 and a second semiconductor element portion 3730 are alternately disposed and bonded onto a driving integrated circuit board 3701. The first semiconductor element portion 3710 includes two light-emitting regions individually controlled to emit the light. The second semiconductor element portion 3730 includes two light-emitting regions individually controlled to emit the light.

The semiconductor element portions described in the first embodiment can be employed in the ninth embodiment. To be more specific, on the driving integrated circuit board 3701 (on which integrated circuit is formed), a reflection layer 3702, first semiconductor element portions 3710, second semiconductor element portions 3730, individual electrodes 3761 and 3762 of the light-emitting elements formed on the first semiconductor element portion 3701, individual electrodes 3763 and 3764 of the light-emitting elements formed on the second semiconductor element portion 3702, common wirings 3775, and input pads 3780 for transmitting signal or supplying power to the driving integrated circuit. Connection pads 3781 and 3782 for connecting the individual wirings of the respective light-emitting elements and the driving integrated circuit are also formed on the driving integrated circuit board 3701.

According to the ninth embodiment of the present invention, the first semiconductor element portion (i.e., the first semiconductor film) 3710 and the second semiconductor element portion 3730 (i.e., the second semiconductor film) are alternately disposed and bonded, and therefore the respective elements can be easily arranged.

In the above described embodiments, the lights emitted by the semiconductor element portions are descried as the visible lights. However, it is also possible to use a semiconductor element portion that emits infrared rays of different wavelengths, a semiconductor element portion that emits infrared rays and visible light at the same time, a semiconductor element portion that emits visible light and ultraviolet rays, or a semiconductor element portion that emits ultraviolet rays of different wavelengths, in combination with a semiconductor element portion that emits the light of another wavelength. In particular, it becomes possible to bond and integrate the semiconductor element portions respectively emitting the lights (for example, the semiconductor element portion that emits infrared rays and the semiconductor element portion that emits ultraviolet rays) whose wavelengths are so different that the light-emitting regions thereof can not be formed in one semiconductor element portion. With such an arrangement, the application range can be widened.

In the above described embodiments, the elements formed by layering the semiconductor layers are diodes. However, it is also possible to form semiconductor lasers, or other active elements such as transistors.

While the preferred embodiments of the present invention have been illustrated in detail, it should be apparent that modifications and improvements may be made to the invention without departing from the spirit and scope of the invention as described in the following claims.

What is claimed is:

1. A composite semiconductor light-emitting device comprising:
    a first semiconductor element portion including a nitride-based semiconductor material, said first semiconductor element portion having a first semiconductor layered structure, said first semiconductor element portion including a plurality of light-emitting regions that emit lights of different wavelengths,
    a second semiconductor element portion including a second semiconductor material different from said first semiconductor material, said second semiconductor element portion having a second semiconductor layered structure, said second semiconductor element portion including at least one light-emitting region that emits light whose wavelength is different from any of the lights emitted by said light-emitting regions, and
    a metal wiring extending on at least said first semiconductor element portion to electrically connect said light-emitting regions of said first semiconductor element portion and said at least one light-emitting region of said second semiconductor element portion,
    wherein said light-emitting regions of said first semiconductor element portion are composed of the same constituent material which is different from said at least one light-emitting region of said second semiconductor element portion.

2. The composite semiconductor light-emitting device according to claim 1, wherein a plurality of said light-emitting regions formed on said first and second semiconductor element portions are connected in series with each other or in parallel with each other.

3. The composite semiconductor light-emitting device according to claim 1, wherein the number of light-emitting regions of said first semiconductor element portion is greater than the number of light-emitting regions of said second semiconductor element portion.

4. The composite semiconductor light-emitting device according to claim 1, wherein said first semiconductor element portion and said second semiconductor element portion are bonded to each other in the same region.

5. The composite semiconductor light-emitting device according to claim 4, wherein said first semiconductor element portion is disposed on said second semiconductor element portion.

6. The composite semiconductor light-emitting device according to claim 4, wherein said first semiconductor element portion is provided below said second semiconductor element portion.

7. The composite semiconductor light-emitting device according to claim 1, further comprising a reflecting layer disposed below said first and second semiconductor element portions or between said first and second semiconductor element portions.

8. The composite semiconductor light-emitting device according to claim 1, wherein said first and second semiconductor element portions are formed on a substrate on which a driving integrated circuit for controlling the light-emission of said light-emitting regions is formed.

9. The composite semiconductor light-emitting device according to claim 1, wherein said first and second semiconductor element portions are formed of semiconductor thin-films separated from semiconductor substrates.

10. The composite semiconductor light-emitting device according to claim 1, wherein said first and second semiconductor element portions are formed on different regions.

11. The composite semiconductor light-emitting device according to claim 1, wherein a plurality of said first semiconductor element portions and a plurality of said second semiconductor element portions are provided, and
    wherein an arrangement is provided for individually controlling light-emission of light-emitting regions of said first semiconductor element portions and said second semiconductor element portions.

12. The composite semiconductor light-emitting device according to claim 11, further comprising an adjusting system for adjusting the color of the emitted light, by individually controlling light-emission of said light-emitting regions of said first semiconductor element portions and said second semiconductor element portions.

13. The composite semiconductor light-emitting device according to claim 1, wherein a plurality of said first semiconductor element portions and a plurality of said second semiconductor element portions are provided, and
    wherein said first semiconductor element portions and said second semiconductor element portions are alternately disposed.

14. A composite semiconductor light-emitting device comprising:
    a first semiconductor element portion including a first semiconductor material, said first semiconductor element portion having a first semiconductor layered structure, said first semiconductor element portion including a plurality of light-emitting regions that emit lights of different wavelengths,
    a second semiconductor element portion including a III-V compound semiconductor material which is different from said first semiconductor material, said second semiconductor element portion having a second semiconductor layered structure, said second semiconductor element portion including at least one light-emitting region that emits light whose wavelength is different from any of the lights emitted by said light-emitting regions, and
    a metal wiring extending on at least said first semiconductor element portion to electrically connected said light-emitting regions of said first semiconductor element portion and said at least one light-emitting region of said second semiconductor element portion,
    wherein said light-emitting regions of said first semiconductor element portion are composed of the same constituent material which is different from said at least one light-emitting region of said second semiconductor element portion.

15. The composite semiconductor light-emitting device according to claim 14, wherein a plurality of said light-emitting regions formed on said first and second semiconductor element portions are connected in series with each other or in parallel with each other.

16. The composite semiconductor light-emitting device according to claim 14, wherein the number of light-emitting regions of said first semiconductor element portion is greater than the number of light-emitting regions of said second semiconductor element portion.

17. The composite semiconductor light-emitting device according to claim 14, wherein said first semiconductor element portion and said second semiconductor element portion are bonded to each other in the same region.

18. The composite semiconductor light-emitting device according to claim 17, wherein said first semiconductor element portion is disposed on said second semiconductor element portion.

19. The composite semiconductor light-emitting device according to claim 17, wherein said first semiconductor element portion is provided below said second semiconductor element portion.

20. The composite semiconductor light-emitting device according to claim 14, further comprising a reflecting layer disposed below said first and second semiconductor element portions or between said first and second semiconductor element portions.

21. The composite semiconductor light-emitting device according to claim 14, wherein said first and second semiconductor element portions are formed on a substrate on which a driving integrated circuit for controlling the light-emission of said light-emitting regions is formed.

22. The composite semiconductor light-emitting device according to claim 14, wherein said first and second semiconductor element portions are formed of semiconductor thin-films separated from semiconductor substrates.

23. The composite semiconductor light-emitting device according to claim 14, wherein said first semiconductor element portion is formed of nitride-based semiconductor material.

24. The composite semiconductor light-emitting device according to claim 14, wherein said first and second semiconductor element portions are formed on different regions.

25. The composite semiconductor light-emitting device according to claim 14, wherein a plurality of said first semiconductor element portions and a plurality of said second semiconductor element portions are provided, and wherein an arrangement is provided for individually controlling light-emission of light-emitting regions of said first semiconductor element portions and said second semiconductor element portions.

26. The composite semiconductor light-emitting device according to claim 25, further comprising an adjusting system for adjusting the color of the emitted light, by individually controlling light-emission of said light-emitting regions of said first semiconductor element portions and said second semiconductor element portions.

27. The composite semiconductor light-emitting device according to claim 14, wherein a plurality of said first semiconductor element portions and a plurality of said second semiconductor element portions are provided, and wherein said first semiconductor element portions and said second semiconductor element portions are alternately disposed.

\* \* \* \* \*